United States Patent
Falls et al.

(10) Patent No.: US 8,633,838 B2
(45) Date of Patent: Jan. 21, 2014

(54) METHOD AND APPARATUS FOR COMPRESSION AND NETWORK TRANSPORT OF DATA IN SUPPORT OF CONTINUOUS AVAILABILITY OF APPLICATIONS

(75) Inventors: Patrick Terence Falls, Newbury (GB); Lyndon John Clarke, Edinburgh (GB); Wouter Senf, Hilversum (NL)

(73) Assignee: Neverfail Group Limited (GB)

( * ) Notice: Subject to any disclaimer, the term of this patent is extended or adjusted under 35 U.S.C. 154(b) by 578 days.

(21) Appl. No.: 12/687,964

(22) Filed: Jan. 15, 2010

(65) Prior Publication Data
US 2011/0179341 A1 Jul. 21, 2011

(51) Int. Cl.
*H03M 7/30* (2006.01)

(52) U.S. Cl.
USPC .......... 341/87; 341/51; 341/55; 341/67; 341/72; 341/89; 714/807; 714/E11.032; 709/247

(58) Field of Classification Search
USPC ........ 341/50–90; 714/807, E11.032; 709/247
See application file for complete search history.

(56) References Cited

U.S. PATENT DOCUMENTS

| | | | |
|---|---|---|---|
| 5,446,888 A | 8/1995 | Pyne | |
| 5,479,654 A | 12/1995 | Squibb | |
| 5,635,932 A * | 6/1997 | Shinagawa et al. | 341/51 |
| 5,990,810 A | 11/1999 | Williams | |
| 6,374,250 B2 | 4/2002 | Ajtai et al. | |
| 6,604,236 B1 | 8/2003 | Draper et al. | |
| 7,116,249 B2 | 10/2006 | McCanne et al. | |
| 7,194,504 B2 | 3/2007 | Moulton | |
| 7,307,552 B2 * | 12/2007 | Ma et al. | 341/51 |
| 7,373,464 B2 | 5/2008 | Zhu et al. | |
| 7,487,169 B2 | 2/2009 | Agarwal | |
| 7,538,695 B2 * | 5/2009 | Laker et al. | 341/51 |
| 2007/0255758 A1 | 11/2007 | Zheng et al. | |
| 2008/0133536 A1 | 6/2008 | Bjorner et al. | |

OTHER PUBLICATIONS

Robert A. Wagner, et al., "The String-to-String Correction Problem", Journal of the Association for Computing Machinery, vol. 21, No. 1, Jan. 1974, pp. 168-173, ACM, New York, New York.

Walter F. Tichy, "The String-to-String Correction Problem with Block Moves", ACM Transactions on Computer Systems, vol. 2, No. 4, Nov. 1984, pp. 309-321, ACM, New York, New York.

(Continued)

*Primary Examiner* — Lam T Mai

(57) ABSTRACT

Methods and apparatus for compressing data for network transport in support of continuous availability of applications are described. One computer-implemented method of compressing data includes receiving a current instance of data in an input buffer. A candidate chunk of data is selected from the input buffer. A signature hash is computed from a signature length range of data within the candidate chunk. A matching dictionary entry having a matching signature hash from a multi-tiered dictionary is identified. The matching dictionary entry prospectively identifies a location of a prior occurrence of a selected range of consecutive symbols including the signature length range of data within at least one of the current instance of data and a prior instance of data in the input buffer. A dedupe processed representation of the instance of data is formed wherein a dedupe item is substituted for the selected range of consecutive symbols if the selected range is verified as recurring. The dedupe item identifies the location of the prior occurrence of the selected range in accordance with the matching dictionary entry.

33 Claims, 25 Drawing Sheets

(56) References Cited

OTHER PUBLICATIONS

Richard M. Karp, et al., "Efficient randomized pattern-matching algorithms", IBM Journal of Research and Development, vol. 31, No. 2, Mar. 1987, pp. 249-260, IBM, Yorktown Heights, New York.

Christoph Reichenberger, "Delta Storage for Arbitrary Non-Text Files", Proceedings of the 3rd International Workship on Software Configuration Management (Trondheim, Norway, Jun. 12-14, 1991), 1991, pp. 144-152, ACM, New York, New York.

Randal C. Burns, et al., "Efficient distributed backup and restore with delta compression", Proceedings of the Fifth Workshop on I/O in Parallel and Distributed Systems (San Jose, California, Nov. 17, 1997), 1997, pp. 27-36, ACM, New York, New York.

* cited by examiner

| INDEX | SH_1 | SH_1 OFFSET | SH_2 | SH_2 OFFSET | CHUNK HASH | REF LOG OFFSET | TYPE | TIME STAMP | LIST | NEXT DE | PREV DE |
|---|---|---|---|---|---|---|---|---|---|---|---|
| 1 | A03D-79C8 | 16 | 7691-29A8 | 3 | 9AB4-19D6-20E7-720A | 39,508,703 | MEDIUM | 35,797 | NEW | 8 | 3 |
| 2 | 70AD-34A8 | 8 | AC37-E420 | 5 | 034D-DA03-16CB-9823 | 35,910,847,040 | LONG | 348,213 | LONG | 10 | 6 |
| 3 | B230-91C0 | 2 | 039D-C030 | 11 | 0000-0000-0000-0000 | 40,920,629 | SHORT | 34,561 | NEW | 1 | 0 |
| 4 | 1747-9C18 | 4 | A540-F7B8 | 7 | 03F4-A540-F7BB-4CB0 | 32,626,964,273 | LONG | 319,741 | LONG | 6 | 0 |
| 5 | FE34-8330 | 6 | DA03-16C8 | 15 | 41AB-039D-C033-D997 | 33,792,956,614 | MEDIUM | 185,505 | MEDIUM | 11 | 7 |
| 6 | 9629-3A88 | 2 | 19D6-20E0 | 13 | 9D00-AC37-E422-00CF | 30,702,745,242 | LONG | 333,977 | LONG | 2 | 4 |
| 7 | 0FA9-D128 | 12 | 034D-9820 | 3 | 0FFA-7691-29AC-5299 | 31,799,971,620 | MEDIUM | 171,269 | MEDIUM | 5 | 0 |
| 8 | 8F9F-0348 | 4 | 03F4-4CB0 | 9 | 0000-0000-0000-0000 | 42,383,012 | UNREF | 37,033 | NEW | 14 | 1 |
| ... | | | | | | | | | | | |
| 32,000 | 0000-0000 | 0 | 0000-0000 | 0 | 0000-0000-0000-0000 | 0 | FREE | 0 | FREE | 0 | 31,999 |

FIG. 11

| LIST | FIRST | LAST | COUNT |
|---|---|---|---|
| NEW | 3 | 23,922 | 4,123 |
| MEDIUM | 7 | 10,412 | 13,973 |
| LONG | 4 | 30,956 | 13,604 |
| FREE | 31,976 | 32,000 | 30 |

DICTIONARY LISTS 1260

FIG. 12

METHOD AND APPARATUS FOR COMPRESSION AND NETWORK TRANSPORT OF DATA IN SUPPORT OF CONTINUOUS AVAILABILITY OF APPLICATIONS

TECHNICAL FIELD

This invention relates to the field of communications. In particular, this invention is drawn to methods and apparatus for compression and network transport of data between a source and target computer in support of continuous availability of applications.

BACKGROUND

The use of computers has become vital to the operation of many government, business, and military operations. Loss of computer availability can disrupt operations resulting in degraded services, loss of revenue, and even the possibility of human casualty.

For example, disruption of financial systems, electronic messaging, mobile communications, and Internet sales sites can result in loss of revenue. Disruption of an industrial process control system or health care system may result in loss of life in addition to loss of revenue.

Some applications can accommodate an occasional error or short delay but otherwise require high availability, continuous availability, or fault tolerance of a computer system. Other applications, such as air traffic control and nuclear power plant control, may incur a high cost in terms of human casualties and property destruction when the computer systems are not available to support the intended processing purpose.

The classifications of high availability, continuous availability and fault tolerance may be further distinguished in terms of recovery point objective and recovery time objective. The recovery point objective is a measure of the amount of data loss that is considered acceptable. The recovery time objective is a measure of acceptable downtime for a computer system after a fault.

Replication of data is an integral part of achieving a desired recovery point or recovery time objective. However, a local copy is susceptible to any catastrophic event that might disable the primary computer system. To protect against a catastrophic failure, the data is typically replicated to a different geographic location. The data being replicated may be compressed for transport in order to conserve network resources.

Enterprise backup software typically offers data compression to a nonvolatile storage media (e.g., magnetic tape, magnetic or optical disk, etc.). Backup software can achieve high compression ratios on a static data set. The high compression is possible in part, however, because the backups are often executed on computers at non-peak times or sometimes on dedicated computers with significant processing, memory and disk resources. The backup software is thus not limited to operating under the computational resource constraints that ordinarily apply. The backup process can take minutes or even hours to complete. Although a prior art backup systems might achieve compression factors on the order of 30×, one disadvantage of prior art backup systems is that they do not perform real time or near real time backup of data. Enterprise backup systems typically have recovery point and recovery time objectives both in excess of 15 minutes that renders such systems unsuitable as the compression mechanism for replication in continuous availability applications.

Prior art wide area network (WAN) optimization products may likewise provide for compression of replicated data for transport. Unlike backup products, however, WAN optimization products need to operate in real time or near real time. WAN optimization products are compressing network messages that typically need to be delivered in less than second. WAN optimization products have limited time and computing resource to process each message. Due to the time constraints, prior art WAN optimization products typically only achieve compression factors of up to 5×.

Thus although enterprise backup systems offers a desirable compression factor, the potential for loss of larger amounts of data and longer recovery time relegates such systems to archival and manual recovery protection rather than continuous availability applications. Although the WAN optimization products may provide a near-real time compression, the compression factor is considerably less than that available from enterprise backup systems due to time constraints. The lower compression factor results in greater consumption of network resources that typically implies a greater cost for replication due to network bandwidth consumption.

SUMMARY

Methods and apparatus for compressing data for network transport in support of continuous availability of applications are described.

One computer-implemented method of compressing data includes receiving a current instance of data in an input buffer. A candidate chunk of data is selected from the input buffer. A signature hash is computed from a signature length range of data starting within the candidate chunk. A matching dictionary entry having a matching signature hash from a multi-tiered dictionary is identified. The matching dictionary entry prospectively identifies a location of a prior occurrence of a selected range of consecutive symbols including the signature length range of data within at least one of the current representation instance of data and a prior representation instance of data in the input buffer. A dedupe processed representation of the instance of data is formed wherein a dedupe item is substituted for the selected range of consecutive symbols if the selected range is verified as recurring. The dedupe item identifies the location of the prior occurrence of the selected range.

Another computer-implemented method of compressing data includes the step of receiving a current instance of data in an input buffer. At least one dedupe exclude range defining a portion of the input buffer to be excluded from dedupe compression is also received. The dedupe exclude range logically partitions the input buffer into at least one dedupe view range. The dedupe compression is a substitution of a dedupe item for non-consecutive occurrences of a recurring range of data. The dedupe item identifies the location of a prior occurrence of the recurring range within at least one of the current representation instance of data and a prior representation instance of data from the input buffer.

Another computer-implemented method of compressing data includes the step of receiving a current instance of data in an input buffer. A repeat pattern replacement (RPR) compression is performed on at least a portion of the current instance of data to store a corresponding RPR processed range at a next available position in a reference log. The RPR compression substitutes an RPR item for a consecutive range of symbols, wherein the value of the RPR item is independent of the location of the consecutive range of symbols. A dedupe compression is performed on each RPR processed portion to store a corresponding dedupe processed range at a next available position in a temporary buffer. A dedupe item is substituted for a selected range of consecutive symbols of the RPR processed range if the selected range is verified as recurring, wherein the dedupe item identifies an offset to the location of the prior occurrence of the selected range in one of the current representation instance or a prior representation instance of data from the input buffer.

Other features and advantages of the present invention will be apparent from the accompanying drawings and from the detailed description that follows below.

BRIEF DESCRIPTION OF THE DRAWINGS

Embodiments of the present invention are illustrated by way of example and not limitation in the figures of the accompanying drawings, in which like references indicate similar elements and in which:

FIG. 11 illustrates one embodiment of a dictionary.

FIG. 12 illustrates one embodiment of a data structure for managing dictionary lists.

DETAILED DESCRIPTION

Figure 1:
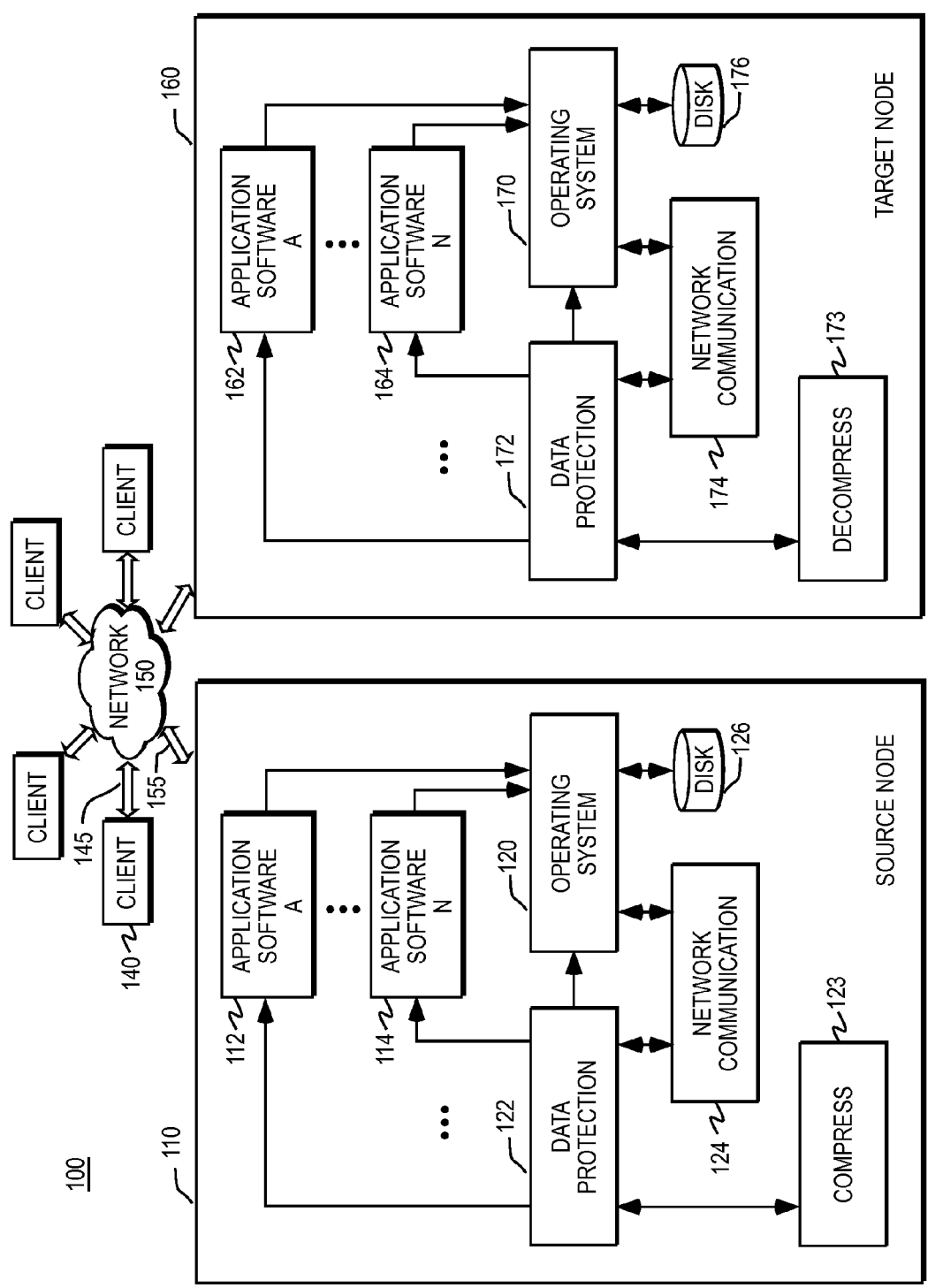
FIG. 1 illustrates one embodiment of a computer network including a source and a target node for data protection.

A continuously available system can be distinguished from other forms of data and application availability by a recovery point objective and a recovery time objective. A continuously available system has a relatively short recovery time objective. In one embodiment, the recovery time is under 10 seconds. The recovery point can be non-zero because a limited amount of data loss is tolerable. In one embodiment, the recovery point objective is approximately 1 second or less. The "continuous availability" is from the perspective of the end-user.

Continuous availability is a desirable metric for many commercial applications. As information is updated at a first geographic location, the information is replicated to a second geographic location to ensure availability in the event of a catastrophic failure at the first geographic location.

Consider an organization with a main office ("source") and a remote ("target"). An application and the data created or utilized in conjunction with the application are maintained at both the main office and the remote office. When the application is re-configured or upgraded at the main office, the application is likewise re-configured or upgraded at the remote office. Similarly, when the information accessed by the application is updated at the main office, the information is also updated at the remote office. Because the information used by the application is stored at two locations, the data is protected and the copy available at one location can be used to restore data to the other location in the event that the data is lost at one location. In addition, any hardware or software fault affecting the operation of the application or the availability of information used by the application at the main office can trigger a "failover" whereby the application is run on a computer system at the remote office with the replicated data.

In order to more efficiently utilize network bandwidth, the data being replicated is compressed prior to communicating the compressed data from the source node to the target node. Although greater compression may make more efficient use of bandwidth, the compression process takes a finite amount of time and computational resources. Allocating computational resources to data compression may significantly impair the ability of the source node to service applications executing on the source node. The allocation of computational resources may be rationed to limit the impairment, however, such rationing inherently increases the time required for data compression. Data compression thus must be performed within the constraints imposed by recovery point and recovery time objectives, transport bandwidth, and available computational resources.

The computer utilizes various storage mechanisms to store and operate on the data. Compression entails reducing the amount of physical storage required to represent selected data. Various physical storage mediums permit the computer to store and operate on data represented magnetically or electrically. Examples of magnetic storage include magnetic random access memory and magnetic disks such as those utilized by electromechanical disk drives. Magnetic storage is a nonvolatile form of storage. Electrical storage mediums include volatile and nonvolatile memory cells that rely upon an electrical state or a charge for storing data.

Buffers and logs are composed of smaller elements of storage that are logically or physically contiguous. Thus in a computer environment, the input buffer, temporary buffer, new and old reference logs, and output buffer such as those subsequently described are logical or physical groupings of a smaller physical element of storage such as memory cells or sectors. Compression of the data carried by a buffer or log results in the transformation of the representation of the data such that a smaller number of memory cells, sectors, or other physical storage structures is required to represent the data.

Generally a first representation of the data is transformed into a second representation of the data that consumes less physical storage (e.g., fewer memory cells, a smaller number of disk sectors, etc.) than the first. Although one approach to compressing data is to discard some portion of the data, the approaches described enable compressing data in a lossless manner such that the original data can be fully recovered from the compressed data.

Deduplication is a lossless data compression approach whereby recurring patterns of data are identified and replaced with a token. The compression techniques used in this invention include a variant of data deduplication. The methodology used for identifying patterns and the tokens used as well as whether the data inherently lends itself to compression are factors that govern the achievable compression ratio for the data. The compression ratio or compression factor may be defined as the ratio of the storage space required for the uncompressed data to the storage space required for the compressed version of the data.

The compression factor that may be obtained greatly depends on the characteristic patterns within the data. Some data may not be compressible by some compression methods, for example because it was created by an application that produces compressed data. Video streams or audio streams are examples of data that is already compressed. Encrypted data similarly may not be readily compressible. The computing resource usage of compression mechanisms is critical for continuously available systems thus attempts to compress data that are unlikely to result in further compression should be avoided.

Some data may be highly compressible. A re-send of a file that has been sent before or communication of a file that is a modified version of a previously sent file can result in achievement of high compression ratios once the duplication is detected. Data with repeating data strings in closer proximity or even adjacent to each other may likewise be highly compressible. Knowledge of the data format characteristics of the applications providing the data for compression can enable significant compression or alternatively result in the use of less computing resources by avoiding attempts to use compression methods that will not yield significant additional compression for that data.

The management of utilization of computing resources for compression is critical for continuously available systems. The use of compression techniques that provide timely compression at significant compression ratios without excessively loading computational resources or that avoid attempts to compress where such attempts are unlikely to be successful support the continuous availability of applications with optimal recovery point objectives and short recovery time objectives.

Overview of Source and Target Nodes

FIG. 1 illustrates one embodiment 100 of a computer system having a source node and a remote target node. A "node" is a computer system. A node can be a client computer or a server computer in a client-server architecture. A node can be a physical or virtual computer. The two node system forms a distributed computer group using replication of data from a first node (source node) to a second node (target node) to enable a desired level of data or application availability to the end user in the event of a failure associated with the source node.

The system comprises two nodes that show interactions of application software 112, 114, 162, 164, a data protection block 122, 172, network communication block 124, 174, and disk 126, 176. Although the computer group may include two or more nodes that can be a mixture of multiple source and target nodes for providing a desired level of data or application availability to the end user, the system shown 100 is one of the simplest embodiments formed by two nodes. A first node is designated as the active or source node 110. A second node is designated as the protect node or target node 160. The first and second nodes are interconnected via at least one network in this case illustrated as 150 and 155.

The data protection blocks 122, 172 are elements of a system that provides protection for multiple applications 112, 114, 162, 164. In one embodiment the applications need only be run on one node, which would be called the "active node". In this embodiment the protected applications are only run on the active node. If 110 is the active node, then in this embodiment the application software 162, 164 would not be present on the target node. In another embodiment the protected applications are run on one or more application nodes on the same local network as the source node. In this embodiment the application software uses a data protection block and network communication block on both the application nodes and the source node to communicate between the application nodes and the source node.

The nodes 110, 160 may have connections 155 to a network 150 for providing services to client computers 140 having connections 145 to the network 150. The network 150 may be a local area network or a wide area network, such as the Internet. Each of the two node computers 110, 160 may be connected to the network 150 via standard hardware and software interface connections 155.

The source node 110 is executing application software A-N (112-114). The source node is configured by the network communication block 124 to be visible via network connections 155 to application client computers 140. The data protection block 122 on the source node 110 intercepts a subset of write operations to the disk 126 by the application software 112-114 using facilities provided by the operating system 120. In various embodiments, some or all of the source data is replicated to disk 176 on the target node. The specific data that is replicated is defined as the data used by the applications 112-114 that are designated as "protected applications".

The network communication block 124 on source node 110 sends these write operations to the network communications 174 on the target node 160 using the network 150, 155. Utilizing operating system 170 resources, the data protection block 172 on the target node 160 executes write operations to the disk 176 on the target node 160 that are equivalent to the operations that occurred on the source node 110. The data protection blocks 122, 172 define the data that needs to be protected. Block 123 handles compression of the data on the source node. Block 173 handles decompression of data on the target node.

Regardless of the underlying purpose of the replication (e.g., backup, network message backup, fault tolerance, continuous availability, etc.), the data must be replicated from the source node to the target node. Often there will be constraints on the bandwidth available for data transport. Data compression may be used to more efficiently utilize the bandwidth available for data transport.

Overview of Compression on the Source Node

Figure 2:
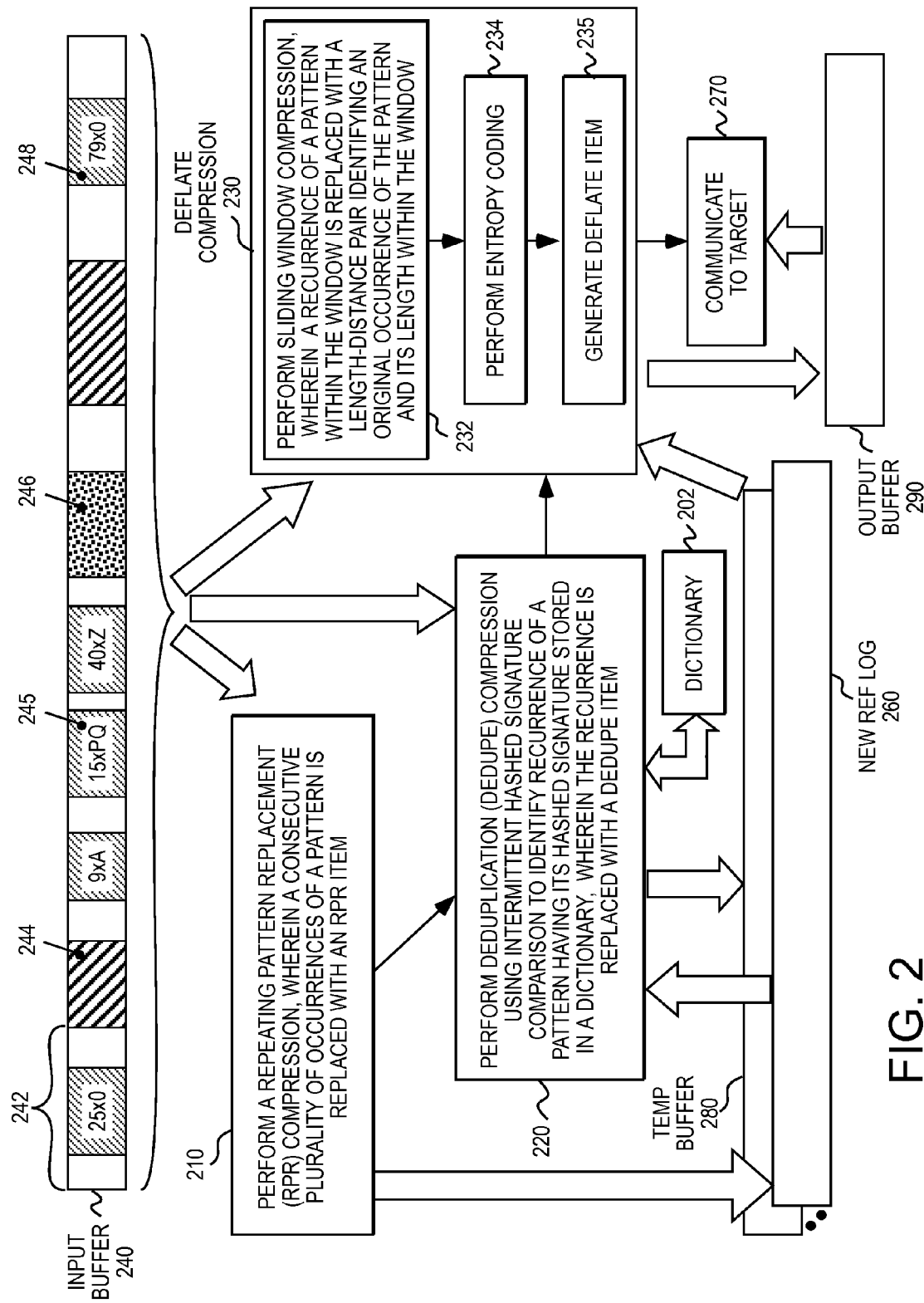
FIG. 2 illustrates an overview of process and data flows for one embodiment of a data compression process at the source node.

FIG. 2 illustrates an overview of process and data flows for one embodiment of a data compression process at the source node. There are multiple modes of compression designed to find recurring patterns of different granularities and distribution throughout a source data set representing several input buffers-worth of data. The modes can be differentiated by method of identifying patterns, limitations on the patterns that can be detected, the token substituted for the pattern, and the granularity of the patterns identified. The three modes are referred to as repeat pattern replacement (or RPR), deduplication (or dedupe), and deflate. These different modes are described in greater detail later in this section.

The source data to be compressed is provided in an input buffer 240. In one embodiment, portions of the source data can be designated for exclusion from one or more modes of compression. The compression process is provided with an input buffer containing the data to be compressed and one or more exclude lists identifying ranges of the input buffer to be excluded from one or more types of compression. The purpose of identifying such ranges is to avoid wasting resources on compression modes that are unlikely to be successful on the identified ranges. Some types of data may already be in compressed form (e.g., JPEG files).

In the context of continuous availability computer systems application protection software residing on the source computer is monitoring various processes for data that needs to be replicated to the target computer system. For some protected applications, the continuous availability software is capable of recognizing characteristics of either the protected application or the data that are indicative of whether the data lends itself to compression or whether the data should be excluded from one or more modes of compression in order to save computational resources. This information is communicated along with the source data.

The compression process may be implemented at least in part utilizing software in the form of processor-executable instructions that form a compression program. The compression program is invoked with parameters identifying an input buffer, an output buffer, exclude ranges for deduplication, and exclude ranges for deflation. Deduplication and deflation are modes of compression that will be described in further detail.

The source input buffer 240 can include data from multiple distinct protected applications. Various ranges 244, 246 may be designated for exclusion from one or more modes of compression. Portions of the input buffer, for example 242, that are not included in any exclusion ranges are eligible to be processed by all modes of compression. In some cases, designation of a range for exclusion from a specified compression mode may implicitly exclude the range from another mode of compression.

A first mode of compression is set forth in block 210. To aid in differentiating the various modes of compression, the first mode of compression is referred to as "repeat pattern replacement" (RPR) mode. A key characteristic of RPR is that it is inherently deterministic. This means that RPR compression of a given sequence of symbols occurring within a range subjected to RPR compression will always produce the same result within the RPR processed output. Because RPR is inherently deterministic it can be used before the second compression mode, dedupe mode, without negatively impacting the compression otherwise achievable by dedupe mode. The third mode of compression, deflate, is generally not deterministic for a given sequence of symbols. A change in position will result in a different representation for the given sequence. Accordingly, deflate is not used before dedupe. RPR compression is applied to eligible ranges of the input buffer in order to identify occurrences of specific patterns that are replaced with an "RPR item" that represents the pattern and is shorter than the pattern.

One embodiment of RPR may be applied to compress a plurality of adjacent consecutive occurrences of a pattern of symbols, wherein the pattern has a length less than or equal to a first granularity, $G_{RPR}$. The consecutive plurality of occurrences is replaced with an RPR item identifying the pattern and number of occurrences. In one embodiment, $G_{RPR} \leq 3$ symbols. Thus the RPR item may represent multiple occurrences of a pattern up to $G_{RPR}$ symbols in length. The term "replaced" is not intended to require that the input string within the input buffer be modified but rather that the output of the first mode of compression generates a result different than the input string in the manner indicated.

RPR is applied to find consecutive occurrences of patterns of relatively short length such as illustrated in regions 245 and 248 of the input buffer. Of note it is not the string of consecutive occurrences but rather the pattern itself that is relatively short in length.

The nomenclature "79×0" is shorthand for illustrative purposes and should be interpreted as seventy-nine consecutive occurrences of the symbol "0". The repeating pattern is not stored within the input buffer literally as "79×0" but rather as 79 consecutive symbols of value "0". Region 245, for example, has fifteen occurrences of a two symbol pattern, "PQ". In this example, each symbol is represented by a single byte. In alternative embodiments, symbols can be represented by other lengths (e.g., multiple bytes) or be of variable length. RPR may also be referred to as "run length encoding". RPR is generally limited to patterns of length less than or equal to $G_{RPR}$ symbols.

Although some types of items are generated by other modes of compression, one embodiment of a general representation for each item or token is as follows:

{<ItemLength>, <ItemType=keyword>, <ItemValue>} where keyword=STRING, RPR, DEDUPE, NODEDUPE, REFUPDATE, DEFLATE, or NODEFLATE.

Although the item is represented in this text as a list of elements and accompanying delimiters, such a representation is for ease of illustration. The item need not actually be stored with delimiters such as brackets and commas. Instead, in one embodiment, a fixed number of bits are reserved for the ItemLength value. Similarly, the keywords are assigned a code that represents the keyword to ensure that a fixed number of bytes, nibbles, or bits may be utilized to represent the ItemType. Given that only a few keywords need to be distinguished for a given stage of decompression, the item type can be less than a byte. The ItemValue may be limited in size based upon implementation, but generally is permitted to vary in length and is interpreted based upon ItemType. In one embodiment, the first symbol of the ItemValue follows the symbol containing the ItemType.

A STRING-type identifies that the ItemValue is a string of symbols. The item value for one type of RPR pattern includes the count of occurrences, the length of the pattern, and the pattern itself (e.g., {<PatternCount>, <PatternLength>, <Pattern>}.

An RPR item for region 248 is represented as follows:
{7, RPR, {79, 1, 'A'}}
wherein "7" indicates the length of the item as stored, "RPR" indicates the type of item, "79" indicates the number of occurrences of the pattern, "1" indicates the length of the pattern, and "'A'" is the repeating pattern. Region 245 may similarly be represented as
{8, RPR, {15, 2, 'PQ'}}

The ItemValue for a different type of RPR item may take on a different form. For example, an RPR item may be used to replace a sequence of symbols that is known to occur for a particular application. In such a case, the ItemValue may simply consist of a symbol or reference that has been associated with that sequence of symbols (e.g., a serial number) in a pre-determined manner. In any case, the content of an RPR item is independent of the location of the given sequence of symbols regardless of the type of RPR item.

A second mode of compression is set forth in block 220. This mode may alternatively be referred to as the "deduplication" or "dedupe" mode. The dedupe mode of compression utilizes hashed signature comparison and a dictionary of prior hashed signatures to identify recurrence of a pattern. Signatures are fixed length ranges and their hashes are used as an efficient means to identify potential matching patterns whose size is at least signature length. The dictionary holds dictionary entries where each dictionary entry is associated with a chunk of data. The length of a chunk of data is equal to or greater than a signature length. Each dictionary entry contains an offset to its associated chunk in a "reference log". The reference log is a partial history of current and previous instances of input buffer data after RPR processing.

The dictionary provides for different types of dictionary entries. The different types allow management of the persistence of dictionary entries within the dictionary based upon different metrics.

In various embodiments, the dedupe mode of compression utilizes intermittent hashed signature comparisons (i.e., hashes of sparsely distributed signature length ranges of data) for identifying patterns. The dedupe mode of compression may also utilize intermittent lookups of computed signature hashes where possible in order to reduce the time required to perform the dedupe mode of compression.

Upon sufficient validation that a matching value of the dictionary identifies the same pattern associated with the hashed signature, the recurrence is replaced with a DEDUPE item.

A DEDUPE item has an item value consisting of a list of values including:
{<CopyRefLogFromOffset>, <CopyLength>}
CopyRefLogFromOffset is the starting point within a "reference log" from which a string will be copied. The number of symbols to copy is indicated by CopyLength. The "reference log" is made up of two portions, namely the "new reference log" and the "old reference log". Both portions are fixed length. In one embodiment, the offset of the first symbol in the old reference log is the length of the new reference log plus one. The "new reference log" is used on the source node for compression. The new reference log is re-created on the target node and utilized for decompression. In addition, portions of the target new reference log may be occasionally copied to an "old reference log" residing on the target node. The old reference log is only maintained on the target node. The new and old reference logs are components of the deduplication mode of the compression and decompression process. In one embodiment, the new reference log is maintained in working memory on the source and target nodes. In one embodiment, the new reference log is a circular buffer. In one embodiment, the old reference log is maintained in bulk nonvolatile memory such as a disk-based storage medium.

The NODEDUPE item has an item value that is the string of symbols excluded from dedupe.

The REFUPDATE item instructs the target node to copy contents of the new reference log to the old reference log. A REFUPDATE item value consists of a list including:
{<CopyRefLogFromOffset>, <CopyRefLogToOffset>, <CopyLength>}
These values indicate the start of the region in the new reference log that will be moved, the length of the region being moved, and the starting location of the destination in the old reference log that the data will be copied to. Some of these terms will be discussed in greater detail with respect to decompression on the target node or with respect to other compression modes on the source node.

The multiple modes of compression do not alter the input buffer contents. Instead, one or more temporary buffers 280 and a new reference log 260 are relied upon as interim storage structures to store representations of that data. The resulting compressed data is placed into an output buffer 290 for communication to the target node.

A window selects a range of data sufficiently long enough to form a pre-determined signature length worth of data. The pattern to be identified has a length at least as large as the signature length. The window is contrasted with the window utilized in other modes of compression. Instead of looking for recurrences of data within the window, the window is moved around in an attempt to identify a recurrence of a symbol sequence that is as long or longer than the window. In one embodiment, the contents of the window are hashed to facilitate speed in identifying prior occurrence in conjunction with the dictionary. The dictionary contains one or more such hash values for signature length ranges of data within a chunk of data. The chunk of data is as long or longer than a signature length. In one embodiment a chunk is at least 10-100 times longer than the signature length.

Each dictionary entry represents a chunk that has previously occurred in the current or a prior instance of input buffer data. The dictionary contains only a partial history of chunks. The chunks persist in the dictionary based upon various metrics.

Due to the nature of using hash values, a prospective match must be validated. One approach is to utilize a stronger hash based upon the whole chunk. This requires computation of a corresponding chunk hash for a chunk containing the signature length range for data. Computation of a stronger hash from a chunk-sized amount of data may be relatively time consuming.

Another approach for validation entails performing a symbol-by-symbol comparison. A symbol-by-symbol comparison can be performed only when the prior occurrence is located in the new reference log. In one embodiment, when a match is detected in the dictionary 202 using hash values and validated against actual data in a new reference log 260, the window is moved about locally in an attempt to find the largest matching pattern which may be larger than the chunk identified by the matching dictionary entry. Once the largest matching pattern is found, a DEDUPE item is substituted in the temporary buffer. The DEDUPE item identifies a recurrence by identifying the location and length of the prior occurrence of the pattern.

In one embodiment, a hashed value of a fixed length signature is calculated at every symbol offset along the entire range of source data subject to deduplication in an effort to locate a matching dictionary entry.

In alternative embodiments, the number of dictionary lookups utilized to identify recurrence of a chunk can be reduced by ensuring that the dictionary entries only store signature hashes having certain properties. This in turn means that the signature hash can be examined to determine whether a dictionary lookup can be avoided. If the signature hash does not have the pre-determined property, it is self-evident that the signature hash will not be used by the dictionary to identify a chunk.

The new reference log has sufficient capacity to hold several input buffer instances worth of deduplicable data. This second mode of compression is useful for finding recurrences of a pattern larger than the signature. The use of the dictionary enables a longer term memory of patterns such that patterns that recur across multiple source input buffers or otherwise have a greater time or spatial separation between recurrences may be identified.

A third mode of compression is set forth in block 230. This mode may be referred to as the "deflate" mode. The combination of blocks 232, 234, and 235 may be referred to as a "deflate" mode in block 230 for purposes of differentiation from the other modes of compression.

Although dedupe can find adjacent duplicates, dedupe is generally used to find recurrences of patterns having a different temporal or spatial separation than those identified with deflate. Deduplication, for example, can identify patterns that repeat across different instances of input buffer data. Deflate is limited to finding repeat consecutive patterns and other patterns that occur within the same deflate view range in the current input buffer. Deflate view ranges are logical partitions of the input buffer which are defined by the location of any ranges that have been identified for exclusion from deflation. Each deflate view range is coextensive with either a) a single deflate exclude range, or b) a range of all consecutive symbols that does not include any portion of a deflate exclude range.

Deflate complements dedupe given that dedupe can only find patterns having a length that is signature length or greater, while deflate can find and replace shorter patterns within a deflate view range in the same instance of input buffer data.

In block 232, a sliding window compression is performed. When a sequence of symbols is identical to a preceding sequence found within the sliding window, the subsequent sequence is encoded as a length-distance pair. Thus recurrences of a pattern within the window can be replaced with a pointer to the original occurrence of the pattern and its length within the window. Block 232 will find both consecutive and non-consecutive occurrences of patterns having a granularity less than or equal to $G_{RPR}$ symbols.

Entropy coding is performed in block 234 to further reduce the storage requirements for the data that has been subjected to block 232. Entropy coding compresses data by using fewer bits to encode the more frequently occurring characters. The entropy encoding introduces some overhead and thus can result in an increase in storage space unless sufficient reductions can be achieved based upon the contents of the data.

In one embodiment, regardless of the absence of any explicit exclusion from the third mode of compression, the third mode of compression will not be performed unless the data to be compressed is of sufficient length such that the third mode of compression is reasonably expected to result in a reduction in storage space. Thus in one embodiment, a range of data will not be processed by the third mode of compression unless the range is of sufficient length (e.g., an implied exclusion based upon the length of the range to be processed). In one embodiment, the entropy coding process utilizes Huffman coding.

In one embodiment, block 232 of the deflate process utilizes a sliding window detection and token replacement approach ("LZ77") as described in J. Ziv and A. Lempel, "A Universal Algorithm for Sequential Data Compression", IEEE Transactions on Information Theory, vol. 23, issue 3, May 1977, pgs 337-343. The entropy coding of block 234 utilizes Huffman coding. In alternative embodiments, other entropy coding approaches (e.g., arithmetic coding) may be utilized.

A DEFLATE item is generated in block 235 for the string resulting from blocks 232 and 234. The three modes of compression are thus applied in cascaded fashion to the contents of the input buffer wherever eligible. The results are placed in an output buffer 290 and communicated to the target node in block 270.

The order of the three modes can reduce the overall computational burden for compression. For example, identification of consecutive recurrences of a pattern as described in the first mode may be considerably faster than the compression processes of the second and third modes. Moreover, the encoding of the recurring patterns reduces the length of the data to be processed for the second and third modes of compression.

The second mode detects matching signatures associated with a larger amount of data in order to identify longer patterns that may recur with varying frequencies. For some types of data, the second mode may significantly reduce the amount of data to be processed by the third mode.

As noted previously, ranges of the source data may be designated for exclusion from one or more modes of compression. This likewise can speed processing by eliminating consideration of ranges that are likely not to compress well for a particular mode. For example, images are often compressed and already stored in a compressed file format. Excerpts from such a file are unlikely to be compressed further using deflation. Excluding ranges associated with compressed image data from deflation can reduce the use of computational resources that are not likely to lead to compression with a given mode. However, the same images may be replicated multiple times so these same images should not typically be excluded from deduplication. An example of content to be excluded from deduplication would be a data corresponding to a streaming video that is stored once to disk and therefore unlikely to result in repeated patterns suitable for deduplication.

With respect to FIG. 2, range 242 illustrates a portion of the source data that has not been explicitly excluded from any mode of compression. Range 244 illustrates a portion of the source data that is designated for exclusion from deflation (i.e., the third mode). Range 246 illustrates a portion of the source data designated for exclusion from the dictionary-based deduplication of the second mode.

Figure 3:
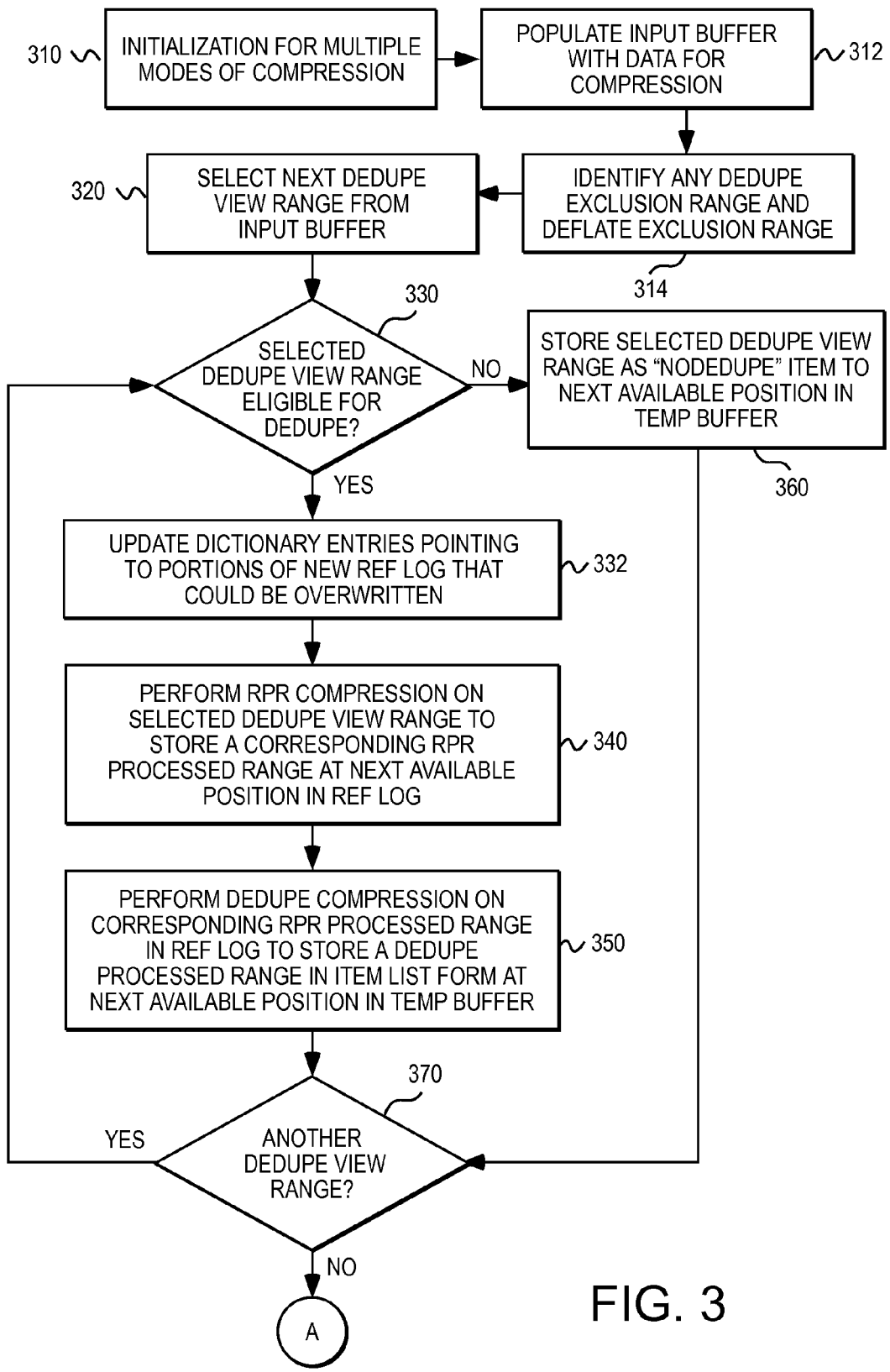
FIG. 3 illustrates one embodiment of a process for performing multiple modes of compression including "repeat pattern replacement" (RPR) and dedupe compression on source node data contained in an input buffer.
Figure 4:
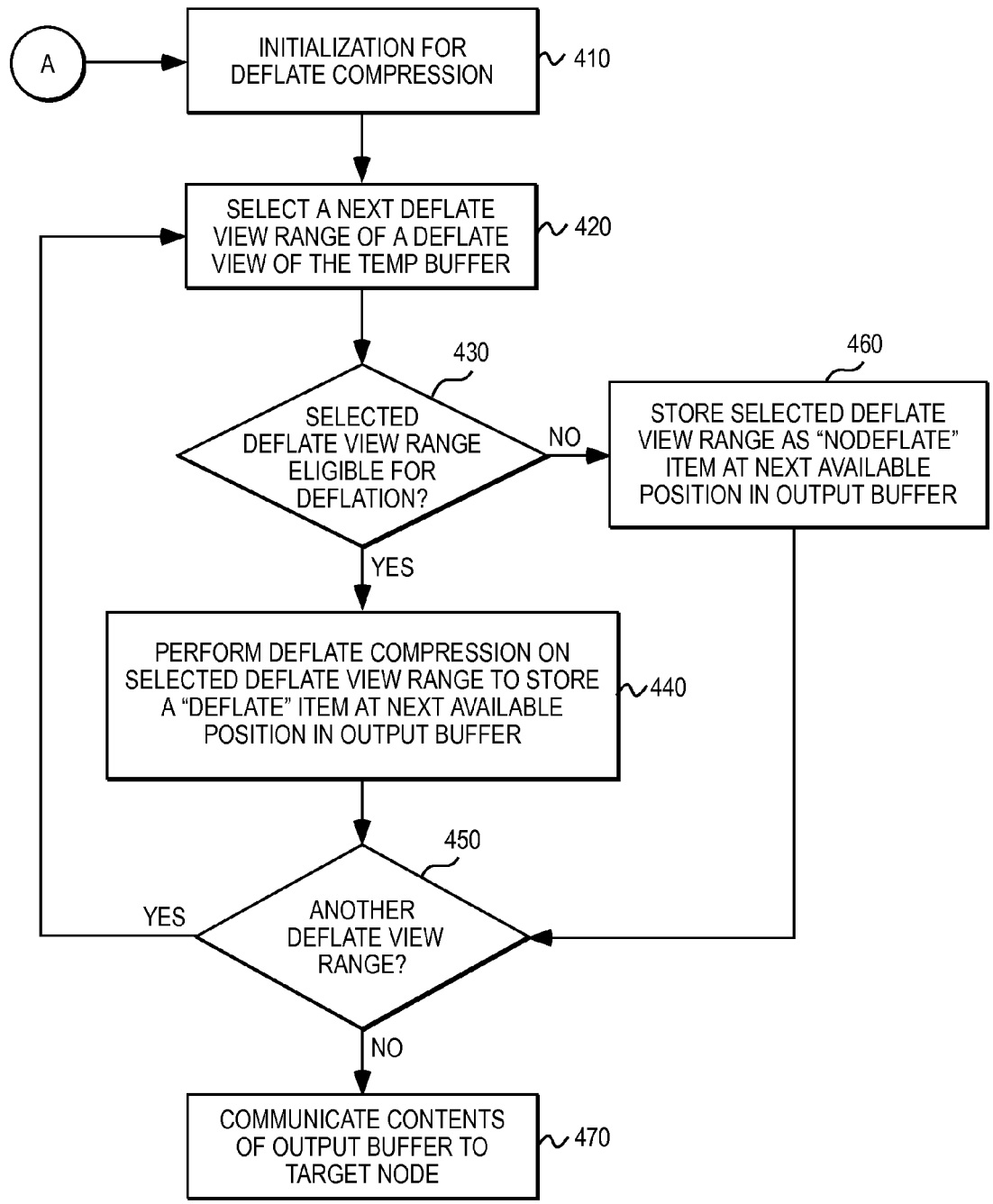
FIG. 4 illustrates one embodiment of a deflate mode of compression.

FIGS. 3 and 4 illustrate at a high level one embodiment of process steps for performing multiple modes of compression on data for an input buffer. FIG. 3 provides more detail on steps 210 and 220 of FIG. 2 and FIG. 4 provides more detail on step 230 of FIG. 2. Reference will also be made to FIGS. 13-17.

The initialization for the overall compression process as well as specifically for RPR and dedupe is performed in step 310. Initialization includes receiving a source data string having a sequence of N symbols into an input buffer. One or more ranges of the input buffer may be designated for exclusion from one or more modes of compression. For example, one or more ranges of the input buffer may be designated for exclusion from either dedupe or deflate compression. A range is a plurality of symbol positions of the input buffer and thus defines a substring of the source data string. Pointers, buffers, counts, flags, etc. specific to RPR and dedupe are also initialized.

Figure 13:
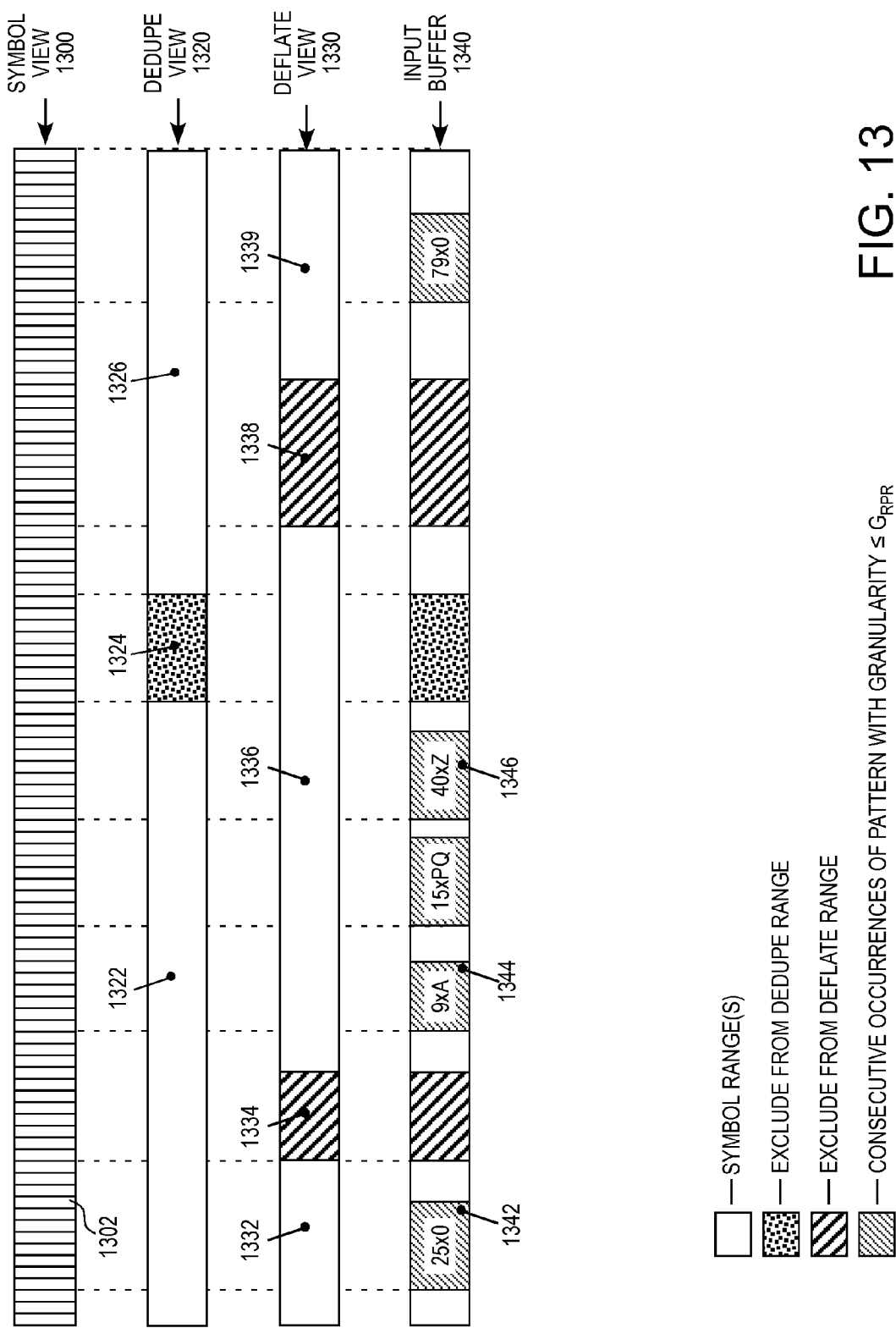
FIG. 13 illustrates views of the contents of a buffer from the perspective of different modes of compression.

Referring to FIG. 13, the source data is provided in input buffer 1340. FIG. 13 illustrates view of the contents of an input buffer from the perspective of different modes of compression. As illustrated by symbol view 1300 of the input buffer, the individual symbols of the input buffer can be located by symbol position 1302. In one embodiment, each symbol is a fixed size. In one embodiment, each symbol is one byte in size. In alternative embodiments, the symbols may be of lengths other than byte-size or of variable length. Each mode of compression can be associated with a view that represents the applicability of that mode to the contents of the input buffer or at least to the portion of the input buffer for which that mode is to be applied.

The dedupe view 1320, for example, illustrates one range 1324 that is excluded from dedupe. The dedupe exclude range 1324 effectively logically partitions the input buffer into three dedupe view ranges, 1322, 1324, and 1326. Adjacent dedupe view ranges have different eligibility for dedupe compression.

A dedupe view partitions the input buffer into at least one dedupe view range, wherein each dedupe view range is coextensive with either a) a single dedupe exclude range, or b) a range of all consecutive symbols that does not include any portion of a dedupe exclude range. If there are no dedupe exclude ranges in the input buffer, then the entire input buffer is described by a single dedupe view range. The term "dedupe view range" describes the grouping of symbols for purposes of handling as a whole rather than specific eligibility for dedupe compression.

With respect to the deflate view 1330, ranges 1334, 1338 that are designated for exclusion from deflation logically partition the input buffer into five deflate view ranges: 1332, 1334, 1336, 1338, 1339. Each deflate view range is coextensive with either a) a single deflate exclude range, or b) a range of all consecutive symbols that does not include any portion of a deflate exclude range.

The different modes of compression will be performed in a particular order and may be prioritized. A range of symbols to be processed by one mode of compression may include one or more exclude ranges for another mode of compression. The views illustrated for deflation and deduplication reflect the views those processes would see if their input was the contents of the input buffer. However, one process will take place subsequent to the other such that both will not receive the same data. For example, the consecutive occurrences of patterns (e.g., 1342, 1344, 1346) may be present in that form within dedupe view range 1322 but are not illustrated to emphasize that they have no impact on the boundaries of the dedupe view range. The exclude from deflate ranges 1334 are likewise irrelevant to the boundaries of the dedupe view range. Similarly, the boundaries for the deflate view ranges are determined solely by the range of the input buffer and the boundaries of any exclude from deflate ranges.

In one embodiment, when processing for one mode of compression encounters an exclude range boundary for another mode of compression in the same view, the offset and length of the boundaries of the exclude range are adjusted to reflect its offset and size after the current mode of compression has been performed. The boundaries for deflate exclude ranges, for example, may be maintained in a deflate exclude map. The deflate exclude map must be updated whenever an item is substituted for a range of symbols.

Figure 14:
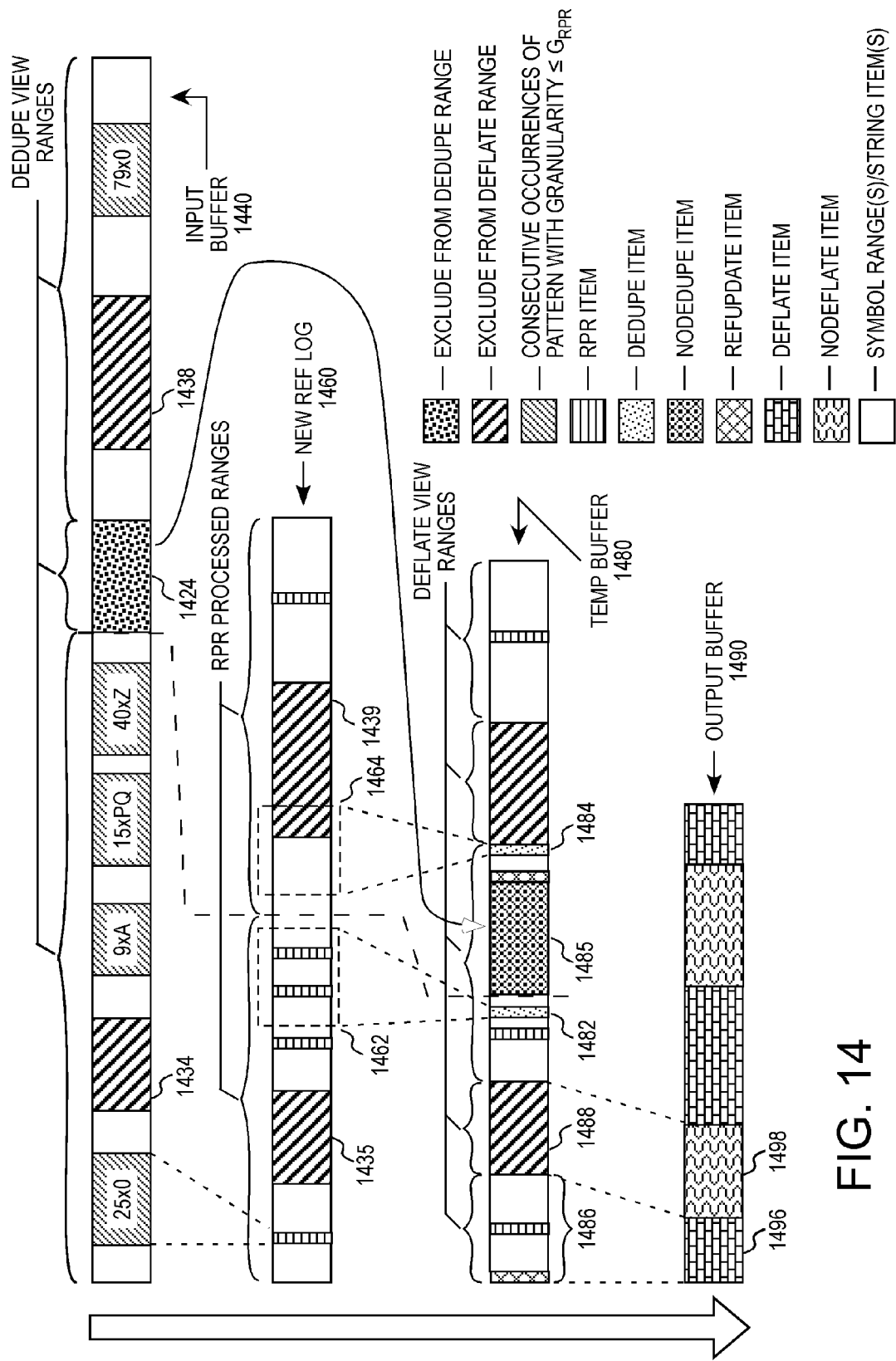
FIG. 14 illustrates one embodiment of the use of buffers during compression.

FIG. 14 illustrates an overview of the use of buffers in the compression process. The data is provided in an input buffer 1440. Some ranges of symbol positions may be declared for exclusion from one or more modes of compression. For example, a range of symbols may be declared for exclusion from dedupe 1424 or for exclusion from deflate 1434, 1438.

The exclude from dedupe ranges partition the contents of the input buffer into one or more dedupe view ranges. Each dedupe view range is processed in turn. The contents of a given dedupe range are converted into RPR or STRING items and stored in the new reference log 1460.

The input buffer data contains the source form of the data. The data is converted into item form when transferred or otherwise represented in any of the other buffers. The exclude from dedupe ranges and the exclude from deflate ranges are initially identified by their offset and lengths within the input buffer. Transformation into a different form in other buffers requires updates to the corresponding offsets and lengths of the exclude ranges.

For example, ranges representing the location of source data within the input buffer to be excluded from deflation must be updated to reference the location of the data within the new reference log and subsequently the temporary buffer as the data is compressed and transformed. For example, the offset and length of an exclude from deflate range 1434 is updated to identify the location of that exclude from deflate range 1435 in the new reference log. The change in position (relative to the beginning of the buffer) is due to the transformation of input buffer contents to RPR and STRING items as they are maintained in the new reference log.

The contents of the new reference log are used for deduplication. Data 1462, 1464 match previous occurrences of the same symbols in previously processed input buffers. They are therefore converted into DEDUPE items 1482, 1484 and stored in the temporary buffer. Exclude from dedupe ranges 1424 are converted into item form as NODEDUPE items 1485 and stored at the next available position in the temporary buffer 1480 in a manner that preserves their location relative to the preceding data in the temporary buffer which may reflect STRING, RPR, DEDUPE, and REFUPDATE items.

The REFUPDATE items are used by the target to maintain the target new and old reference logs. The contents of exclude from deflate range are initially stored as STRING items in the new reference log. However due to the RPR compression and dedupe compression, the location of the actual data (the item value) of the STRING item will move relative to its original position in the input buffer. The tracking of the deflate ranges is updated to reflect the location of the associated symbols in the temporary buffer 1480.

The exclude from deflate ranges partition the temporary buffer into one or more deflate view ranges. Each deflate view range is operated upon in sequence. The deflation process handles the range of symbols as a range of symbols rather than recognizing individual objects or items within the deflate view range. Thus the codes identifying "RPR", "STRING", "DEDUPE", etc. keywords are simply data from the perspective of the deflate process.

The contents of deflatable deflate view ranges 1486 are deflated and stored as DEFLATE items 1496 in the output buffer 1490. The contents of exclude from deflate ranges 1488 are stored as NODEFLATE items 1498 in output buffer 1490.

The exclude from dedupe ranges 1424 are not transferred to the new reference log. Instead, such ranges are copied from the input buffer and stored as a NODEDUPE item 1485 at the next appropriate location within the temporary buffer 1480.

Referring to FIG. 3, initialization of the three mode compression process is performed in step 310. In step 312, the source uncompressed data is received into a source input buffer containing a count and list of symbols to be compressed. Two separate lists describing the source uncompressed data are also received by the processor performing the compression process. The two separate lists identify ranges of symbols within the input buffer that are to be excluded from dedupe and deflate compression as indicated in step 314. The dedupe exclude ranges effectively partition the data into a plurality of dedupe view ranges.

Each dedupe view range of the input buffer is selected in turn. In step 320, the next dedupe view range of the input buffer is selected. In one embodiment, an RPR compression is not performed on dedupe exclude ranges. The dedupe process will not benefit from an RPR performed in a region that is excluded from dedupe and to the extent that the dedupe and deflate ranges overlap, an RPR compression will be performed within the deflate mode of compression anyway.

If the selected dedupe view range is ineligible for dedupe compression as determined by step 330, the selected dedupe view range is converted into a NODEDUPE item and stored beginning at the next available position in the temporary buffer in step 360.

If the selected dedupe view range is eligible for dedupe as determined by step 330, then RPR compression is applied to the selected dedupe view range. Prior to performing RPR compression for a selected dedupe view range, any dictionary entries which have new reference log content that could be overwritten by the new RPR compressed data must be deleted or have their associated content moved. Step 332 scans the list of dictionary entries in new reference log offset order and finds any which could be overwritten by step 340. A dictionary entry could be overwritten if its reference log offset is a value between the current offset in the new reference log minus chunk length and the current offset in the new reference log plus the length of the current dedupe view range. Any dictionary entries that match this criteria and for which no matching content has been found are deleted. If a dictionary entry is found that has been previously matched, a REFUPDATE item is added to the temporary buffer to instruct the target node to move the content to the old reference log. When a REFUPDATE item is added the reference log offset, list, and list position of the dictionary entries are updated to point to the new location in the old reference log.

In step 340, RPR compression is performed on the selected dedupe view range to store a corresponding RPR processed range as an item list at the next available position in the new reference log. The new reference log is a short term reference log used on the source side as a feedback mechanism for creating and maintaining a dictionary and identifying recurring patterns of data for the dedupe compression process. In one embodiment, the new reference log is a circular buffer.

In step 350, a dedupe compression is performed on the corresponding RPR processed range. The dedupe processed range is stored as a STRING item at the next available position within the temporary buffer.

The process of FIG. 3 continues until all dedupe view ranges of the input buffer have been handled as determined by step 370. Once the dedupe view ranges have been handled, processing then continues with the deflate compression stage set forth in FIG. 4.

Figure 15:
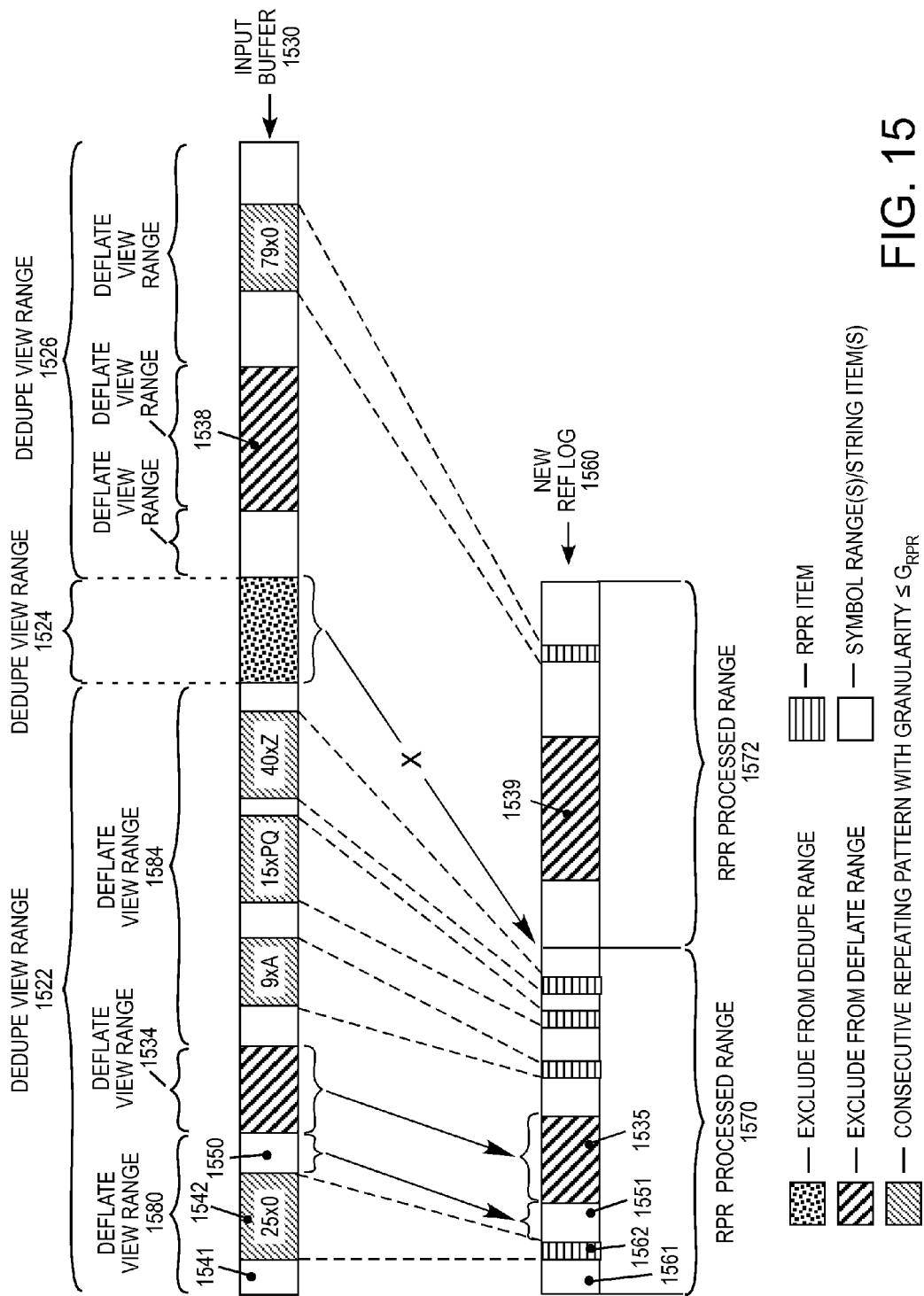
FIG. 15 illustrates views of the contents of the input buffer from the perspective of consecutively applied modes of compression to populate the new reference log.

FIG. 15 illustrates RPR compression of the contents of input buffer 1530 into the new reference log 1560. A dedupe view of the input buffer logically partitions the input buffer into three dedupe view ranges 1522, 1524, 1526 due to the existence and location of the exclude from dedupe region 1524. A deflate view of dedupe view range 1522 results in a logical partitioning of dedupe view range 1522 into three deflate view ranges 1580, 1534, and 1584. During RPR compression each deflate view range of the dedupe view range is selected in sequence. An RPR compression does not cross deflate view range boundaries.

Consecutive occurrences of patterns with a granularity less than or equal to $G_{RPR}$ such as 1542 are replaced with an RPR item 1562. Thus, deflate view range 1580 will be decomposed into three regions 1541, 1542, 1550 which will be stored within the new reference log in item form as STRING item 1561, RPR item 1562, and STRING item 1551, respectively. The contents of deflate exclude ranges 1534 and 1538 are converted to STRING items 1535 and 1539 and stored at their corresponding position in the new reference log 1560 preserving the relative order. Once the RPR compression has been applied to each of the deflate view ranges 1580, 1534, 1584 within a deflate view range 1522, the result is an RPR processed range 1570 within the new reference log 1560.

The content of a dedupe exclude range 1524 is not stored to the new reference log. In this embodiment, no RPR compression takes place within ranges identified as dedupe exclude or deflate exclude. Accordingly, RPR processed range 1570 corresponding to dedupe view range 1522 and RPR processed range 1572 corresponding to dedupe view range 1526 are adjacent to each other in the new reference log because intervening dedupe view range 1524 from the input buffer is not converted or compressed into the new reference log.

Figure 16:
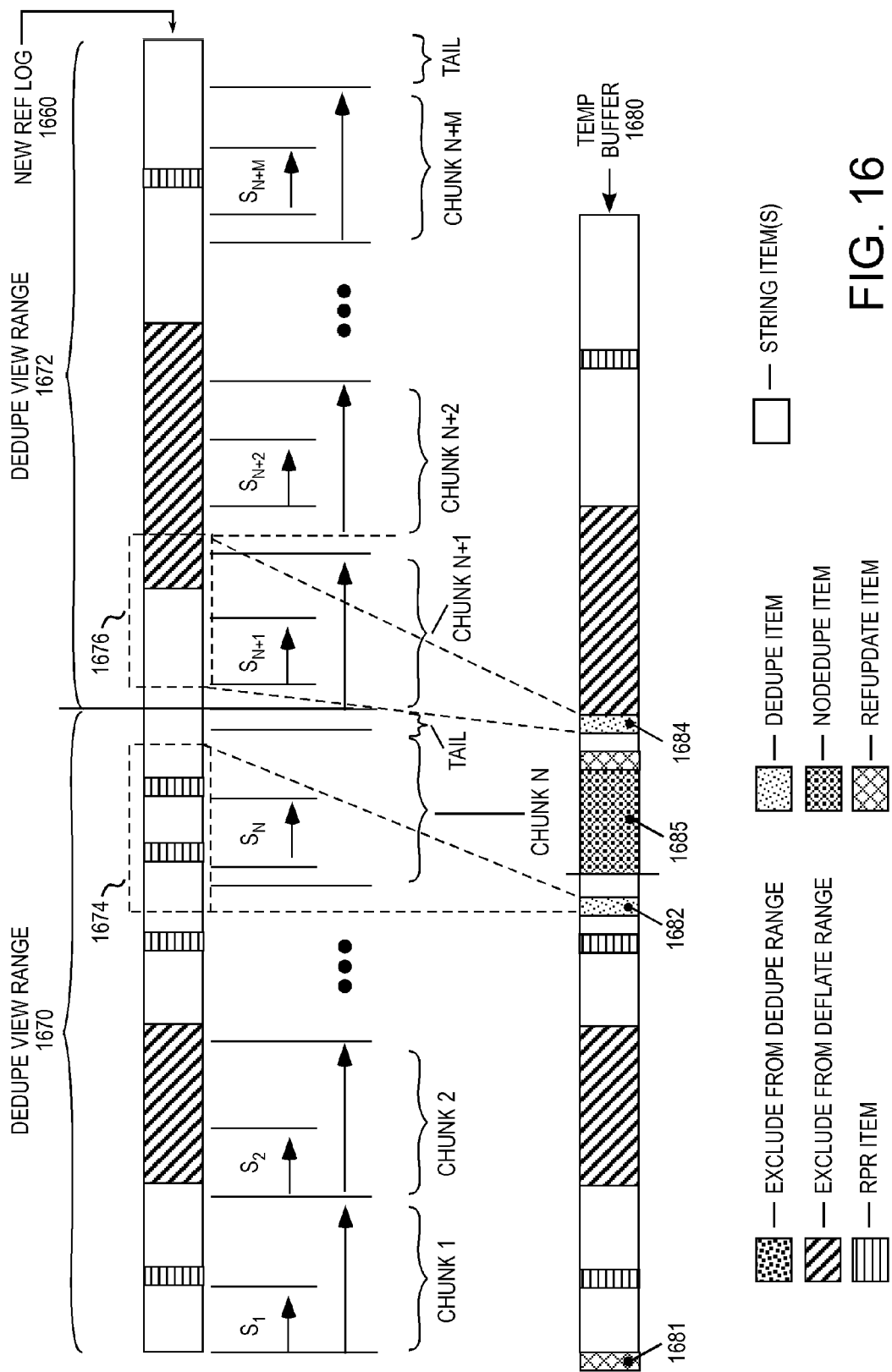
FIG. 16 illustrates the application of the dedupe mode of compression to the RPR-processed ranges within the new reference log.

FIG. 16 illustrates the application of the dedupe mode of compression to the RPR processed ranges 1670 and 1672 within the new reference log 1660. The result of dedupe compression is written to temporary buffer 1680 along with any dedupe exclude ranges from the input buffer while preserving the relative order. Thus after performing dedupe on 1670 a NODEDUPE item 1685 is placed in the temporary buffer for the dedupe exclude range 1524 so that the compressed data in the temporary buffer is in the same order as the corresponding data in the input buffer.

Dedupe compression results in substitution of a token such as DEDUPE items 1682 and 1684 for symbol ranges 1674 and 1676 because symbol ranges 1674 and 1676 match data previously held in the new reference log from the same or previous input buffer. During dedupe compression REFUPDATE items 1681 may be placed in the temporary buffer. The REFUPDATE item instructs the target node to copy data from the target new reference log to a target old reference log for subsequent use by the decompression process on the target node.

FIG. 4 illustrates one embodiment of the third compression mode called the "deflate" process. The deflate process operates on the compressed data resulting from the first two modes of compression which resides in the temporary buffer.

The deflate process is initialized in step 410. A deflate view logically partitions the temporary buffer into at least one deflate view range. Each deflate view range is coextensive with either a) an item value associated with a single deflate exclude range, or b) a range of all consecutive symbols that does not include any portion of an item value associated with a deflate exclude range. If there are no deflate exclude ranges then the entire temporary buffer is described by a single deflate view range. The term "deflate view range" describes the grouping of symbols for purposes of handling as a whole rather than specific eligibility for deflate compression.

In step 420 a next deflate view range of a deflate view of the temporary buffer is selected. Step 430 determines whether the selected deflate view range is eligible for deflate compression. If not, then the selected deflate view range is stored from the temporary buffer to the next available position in the output buffer in step 460 as a NODEFLATE item. If the selected deflate view range is eligible for deflate compression, then a deflate compression is performed on the selected deflate view range to form a DEFLATE item at the next available position in the output buffer in step 440.

Once the selected deflate view range has either been stored to the output buffer or deflated into the output buffer, step 450 determines whether there are more deflate view ranges in the temporary buffer. If so, the process is repeated with the next deflate view range. Once the contents of the temporary buffer have been processed in this fashion, the contents of the output buffer are available to be communicated to the target node in step 470.

Figure 17:
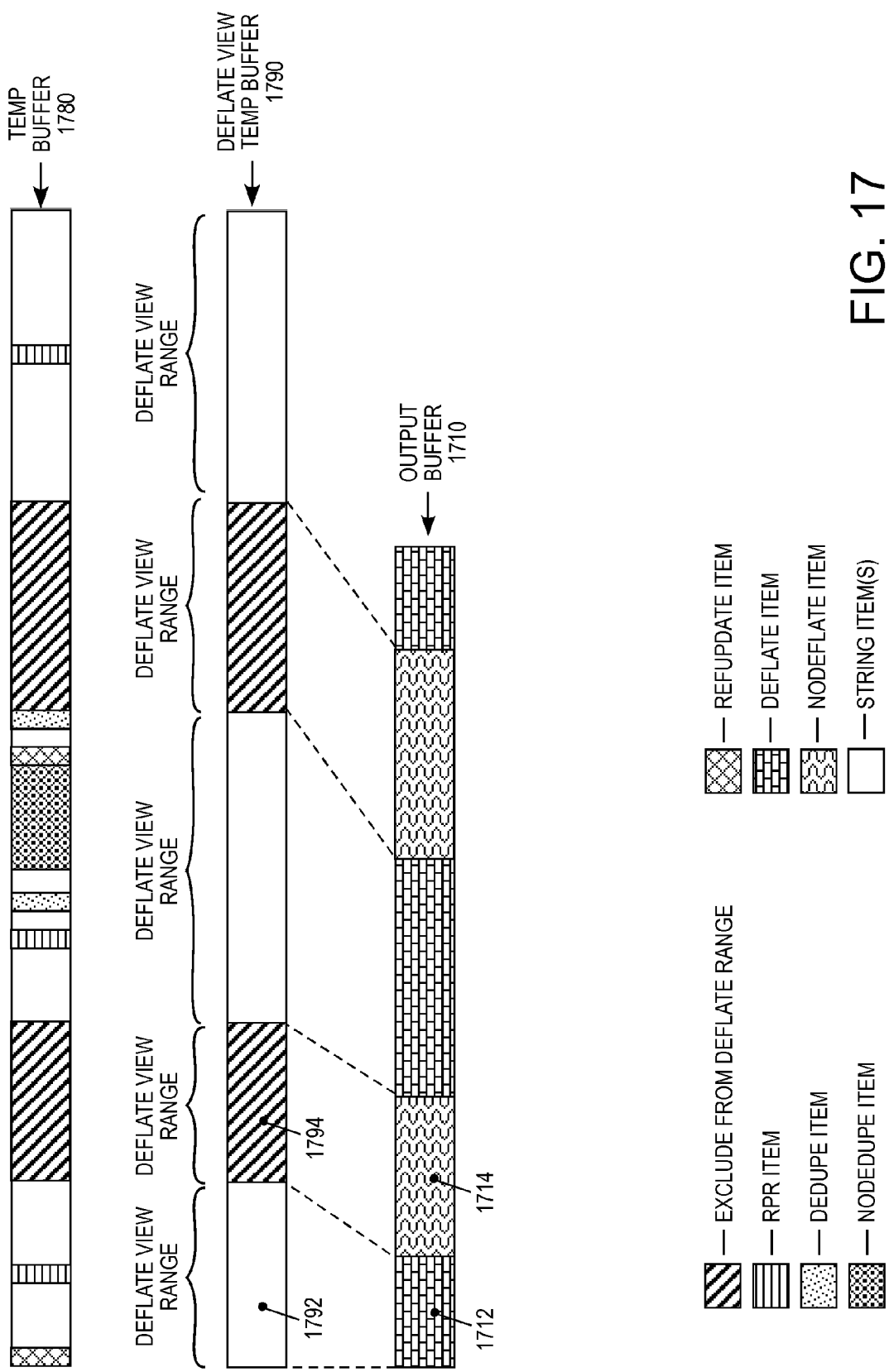
FIG. 17 illustrates one embodiment of a deflate view of a temporary buffer and deflation into an output buffer.

FIG. 17 illustrates one embodiment of a temporary buffer 1780 and a deflate view 1790 of the temporary buffer. The deflate view logically partitions the contents of the temporary buffer into one or more deflate ranges 1792, 1794. Each deflate view range is coextensive with either a) a single deflate exclude range such as 1794, or b) a range of all consecutive symbols such as 1792 that does not include any portion of a deflate exclude range.

The deflate compression is performed only on a deflate view range such as 1792 that is eligible for deflate compression. Deflate compression forms a corresponding DEFLATE item, such as 1712, at the next available position in the output buffer. A deflate view range that is not eligible for deflate compression is stored as a NODEFLATE item, such as 1714, at the next available position in the output buffer 1710. In the illustrated embodiment, ranges that are ineligible for deduplication may still be subjected to deflation. Similarly, ranges that were processed by deduplication may also be subjected to deflation.

RPR Compression

Figure 5:
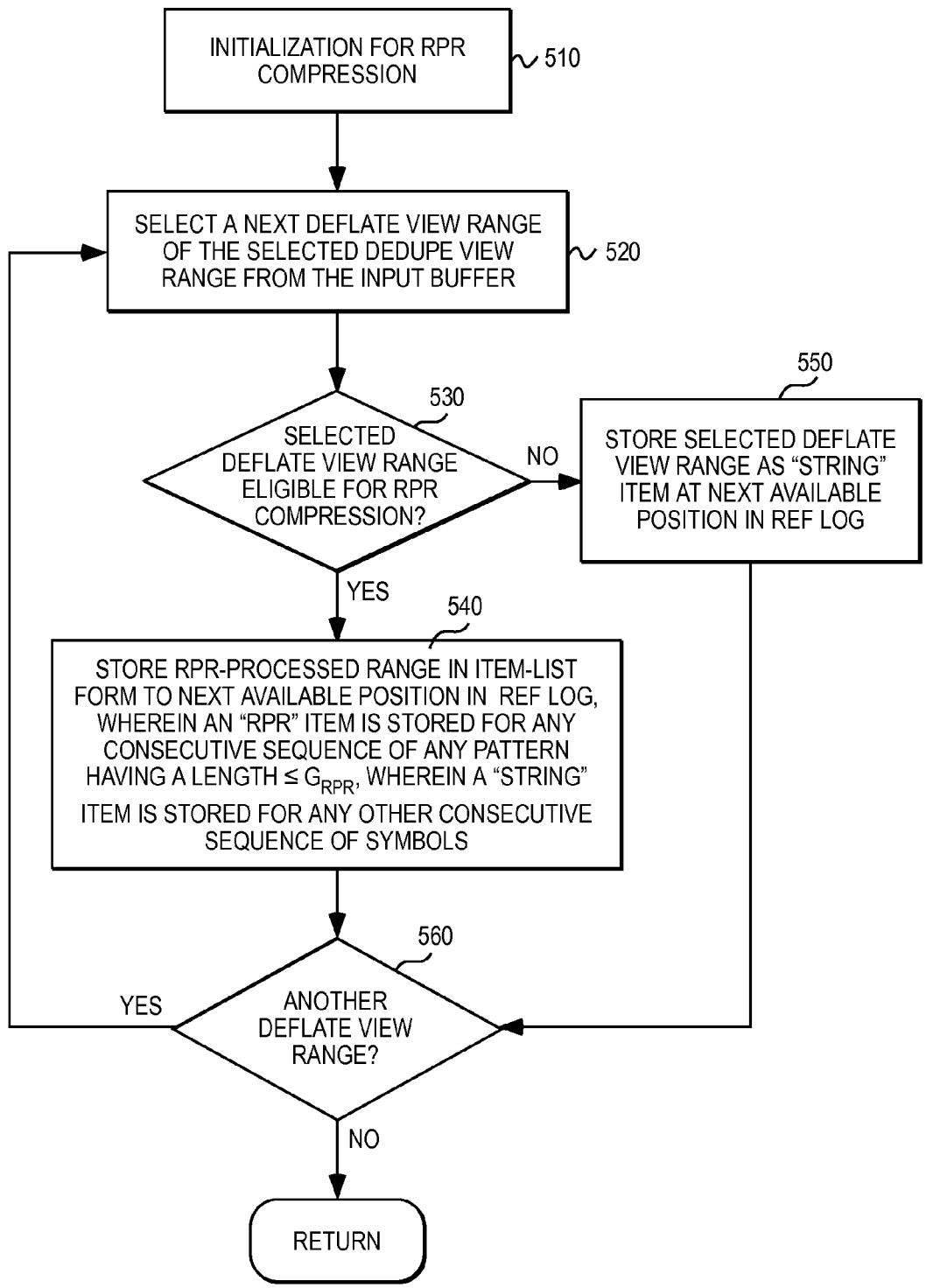
FIG. 5 illustrates one embodiment of an RPR compression process.

The RPR step 340 of FIG. 3 is set forth in greater detail in FIG. 5. In step 510, initialization of RPR compression is performed. Although this may be accomplished in piecemeal form, the aggregate effect is that the selected dedupe view range is logically partitioned into at least one deflate view range.

A next deflate view range of the selected dedupe view range is selected in step 520. If the selected deflate view range is not eligible for RPR compression as determined by step 530, then the selected deflate view range is copied to the next available position within the reference log as a STRING item in step 550. Otherwise, an RPR processed range is written to the next available position in the reference log in step 540, wherein an RPR item is substituted for each consecutive sequence of any pattern having a pattern length≤$G_{RPR}$ and all other consecutive symbols are stored as STRING items. Each time an RPR item is substituted, any deflate exclude ranges located after that sequence are adjusted to "re-map" the deflate exclude ranges to new offsets in the temporary buffer. The adjustment accounts for the difference in length between that sequence and the associated RPR item that shifts the location of the temporary buffer deflate exclude range boundaries.

The process continues with the next deflate view range if any remain as determined by step 560.

Dedupe Compression

FIGS. 6-10 describe the deduplication step 350 of FIG. 3 in greater detail. The dedupe mode of compression utilizes a reference log and a dictionary. The contents of the reference log are used to maintain the dictionary and to validate matches during dictionary lookup.

The reference log for the source and target nodes may be described in terms of a new reference log and an old reference log. A new reference log is maintained on both the source and target nodes. An old reference log is only maintained on the target node. The offset to chunks of content in the old and new reference log, is maintained in the dictionary on the source node.

The new reference log is used to store several input buffer's worth of data that is potentially deduplicable. The new reference log does not include the content from any dedupe exclude ranges of any input buffer. The new reference log stores only content eligible for deduplication after RPR compression has already been applied. The new reference log in conjunction with the dictionary permit deduplication of patterns that may recur several input buffer's worth of data apart.

The dictionary is not communicated to the target node as such. Instead, DEDUPE items are transmitted to the target node. These DEDUPE items contain the offset and length of a previously matching range of data in the reference log. This allows the target node to replace the received DEDUPE items with their matching content from the target reference log.

The target node new reference log matches the source node new reference log. However, instead of discarding the contents of the target node new reference log, such contents are selectively migrated to an old reference log on the target node. The source node controls which contents of the target's new reference log are migrated to the target's old reference log by transmitting REFUPDATE items. The REFUPDATE items instruct the target node to copy content specified by the REFUPDATE item from the target's new reference log to a specific location in the target's old reference log.

FIG. 11 illustrates one embodiment of a dictionary 1110. The dictionary is maintained in memory on the source node. The dictionary is a fixed length array of fixed-length dictionary entries such as 1140. The entries are accessible using an index number 1112 or a signature hash value 1114 or 1116.

Dictionary entries contain information (e.g., signature hashes, etc.) needed to match most recently added content in the new reference log with content previously added to the new and old reference log. Depending upon implementation, the dictionary entry may contain information enabling the matching of most recently added content in the new reference log with content previously added but which has been moved to the old reference log.

The signature hash fields 1114, 1116 contain hash values for signatures associated with a chunk of data. The chunk hash field 1118 contains hash values for a complete chunk. In one embodiment, a rolling checksum is used to compute the signature hash values and a Cyclic Redundancy Check (CRC) is used to calculate the chunk hash. The hash values shown in the example are illustrated as a sequence of hexadecimal values. Thus 'A03D-79C8' is a 32 bit signature hash for the dictionary entry with index value of 1, and '9AB4-19D6-20E7-720A' is a 64 bit chunk hash for the complete chunk.

The signature hash offsets 1115, 1117 are offsets from the start of a chunk which define the start of the range of fixed length signature data within a chunk which is associated with that dictionary entry. Thus the dictionary entry with index of 1 (1140) references a chunk that has a first signature hash (SH_1) of "A03D-79C8". This signature hash represents a hash value computed from a signature length range of data beginning at an offset of 16 symbols from the beginning of the chunk. Similarly, a second signature hash (SH_2) with value "7691-29A8" is computed from a signature length range of data beginning at an offset of 3 symbols from the beginning of the chunk.

In various embodiments, the dictionary may track a different count of signature hash values corresponding to signature lengths of data starting at different offsets for each chunk that can be referred to as a "multi-signature" method. The multiple signatures reduce the number of dictionary calculations and lookups required by only performing lookups for a fraction of the signatures in each chunk where the fraction corresponds to the signature count.

Use of signature count is analogous to splitting chunks into "slots". For a signature count of two there are two slots. The first slot represents signatures starting at the even offset symbols from the start of a chunk and the second the odd offset symbols. The start of a matching signature in a candidate chunk can be at a different offset in the chunk from the matching signature in the dictionary entry chunk. To find matching signatures it is sufficient to use signature hashes from one slot in the candidate chunks to perform dictionary lookups to find matching signature hashes in any slot in the dictionary entries. Thus if the signature count is four, approximately one quarter of the signature hashes need to be calculated and looked up.

In the illustrated example, a signature count of two is used. SH_1 is at even number offsets and SH_2 is at odd number offsets. This means that when checking for a match every second rolling checksum need be looked up as this is guaranteed to match either the odd or the even numbered offset signature for a chunk with a matching signature, but with the same or different signature offset. The more signatures used the fewer dictionary lookups are needed, but the more memory is needed to hold the extra signatures in the dictionary. So ultimately this is a tradeoff between speed of processing and memory. In the event of a single signature hash, the offset can be pre-determined (e.g., "0") such that a separate column identifying the offset may be dispensed with.

In various embodiments the signature hash can be limited to a subset of the possible signatures using a "sparse signature" method. In the example shown only signature hashes whose last three bits are zero are chosen as signature hashes. This is why the last hexadecimal value for the signature hashes are either '0' or '8'. By limiting the set of possible signatures, the number of dictionary lookups is reduced. So in this example only one in eight rolling checksums will need to be looked up, thereby increasing the speed of find matching chunks. Multi-signature and sparse signatures can be used together to increase the speed of finding matching chunks. In the cases where in a candidate chunk there are no unique signature hashes at each signature count aligned offset with the necessary sparse signature hash pattern then no dictionary entry is added for that candidate chunk.

The dictionary entries optionally include a chunk hash 1118 that is used as a method to verify that two chunks with matching signature hashes are the same. Chunk hashes are not required in an embodiment that only uses a new reference log. In such a case, the signature hashes are used to identify a prospective match and then an actual content comparison can be done to verify that the chunks associated with those signatures are the same (i.e., the content of both exists in the new reference log). In an embodiment where chunk hashes are used for verification, the computational resources and time to calculate a chunk hash is likely to be greater than that required to perform a content comparison. Accordingly a content comparison may be utilized in lieu of a chunk hash comparison if the chunks associated with the signatures are in the new reference log. In an embodiment where both chunk hashes and multiple signatures are used, then there may also be a processing time advantage in comparing all the signature hashes before comparing the chunk hash.

Chunk hashes are required where an old reference log is used to allow matches of content over longer time periods to achieve even greater deduplication compression. The chunk hash is needed in this case to verify that a new chunk whose signature matches a chunk in the old reference log is the same chunk because there is no old reference log maintained on the source node. The likelihood of two non-matching chunks having the same chunk hash is sufficiently remote that matching chunk hashes is sufficient verification of a match.

The computational resources and time required for computing such a hash (e.g., a "strong checksum") are greater than that required for computing the rolling checksum. Because chunk hashes are only needed after a chunk has been moved from the new reference log to the old reference log, the calculation of the chunk hash can be delayed until the matching content is about to be moved to the old reference log. This explains why dictionary entries in the example with indexes of 3 and 8 do not have a calculated chunk hash.

The REF_LOG OFFSET 1120 is the absolute offset of the start of the matching data within the reference log. If the value is less than or equal to the size of the new reference log, then the matching data resides within the new reference log. If the value exceeds the size of the new reference log, then the reference log offset is pointing to the location of the matching data in the old reference log residing on the target node. In another embodiment the reference log offset could be relative to the start of the old or new reference log and a separate field in the dictionary would define whether the dictionary entry referred to the new or old reference log.

The TYPE 1122 represents the type of dictionary entry as UNREF, SHORT, MEDIUM, LONG, or FREE. The TYPE field causes the dictionary to be partitioned into multiple tiers to support persistency of dictionary entries based on age and frequency of occurrence of matching data. The multiple tiers allow different methods to be used for efficiently finding and verifying a prior occurrence of a selective range of symbols in different tiers. The terms "multi-tier" or "multi-tiered" refer to the multiple tiers.

SHORT, MEDIUM and LONG 'type' relate to a relative length of time since a match was first made (i.e., in view of the rate that the data is being compressed). The relative length of time is dependent on the time to fill the new and old reference logs with most recently used content. For example in one embodiment, SHORT types may reflect content that was last matched within a few minutes, MEDIUM types reflect content matched more than ten minutes prior, and LONG types reflect content that was matched hours earlier. UNREF type means a dictionary entry has been added using content in the new reference log but no matching content has been found. A SHORT type refers to a dictionary entry that has been matched with other content within the new reference log. Each time a dictionary entry is matched with new content in the new reference log the REF LOG OFFSET is updated to reference the latest copy of the content. This means that content that keeps getting re-matched will be retained in the new reference log as long as possible.

In one embodiment the new reference log is a circular log, so every time new content is added it will typically need to overwrite older content. Dictionary entries for content in the new reference log that is about to be overwritten are identified and they will then either be deleted (i.e., if the dictionary entry type is UNREF) or the content is moved to the old reference log using an REFUPDATE item. When a dictionary entry is changed to refer to the old reference log, and its type was SHORT then the SHORT type is changed to a MEDIUM type entry.

A dictionary entry in the new reference log can be a MEDIUM or LONG type, which means it had previously been moved to the old reference log, and then re-matched resulting in their REF LOG OFFSET being update to the new content in the new reference log. If they then are subsequently about to be overwritten they will be again moved back to the old reference log, but their type will remain as either MEDIUM or LONG.

A dictionary entry transitions from SHORT to MEDIUM type when the content first moves from the new reference log to the old reference log. FIRST ADDED TIMESTAMP 1124 is used for managing the transition of TYPE between MEDIUM and LONG. MEDIUM type dictionary entries are transitioned to LONG based upon matches that occur after a pre-determined time frame (e.g., a day, etc.) from the time that the content was first added to the new reference log. The purpose of the distinction between MEDIUM and LONG types is to ensure that a burst of deduplicable patterns does not eliminate dictionary entries that have already proven to recur over longer periods of time.

When content is copied from the new reference log to the old reference log, it will be of type MEDIUM or LONG, and will be added to the start of a list of content that is in most recently used order. There is a maximum amount of available space for MEDIUM and LONG content in the old reference log. So when content is added to the old reference log there is a high probability that content may need to be removed to make room for it. If this is the case then the content that is associated with the least recently used dictionary entry of the same type will need to be replaced. If the type is MEDIUM then if the least recently used dictionary entry of MEDIUM type has a FIRST ADDED TIMESTAMP that is greater than a configurable value, e.g. a day, then it will be updated to be the most recently used dictionary entry of type LONG. This in turn can mean that the least recently used dictionary item of type LONG may need to be deleted. Where the least recently used dictionary item of MEDIUM type does not meet the old enough FIRST ADDED TIMESTAMP criteria, then it is deleted.

When the dictionary is first initialized it has a fixed number of dictionary entries all of which are of type FREE. As dictionary entries are added, dictionary entries of type FREE are changed to dictionary entries of type UNREF, which in turn can change over time to SHORT, MEDIUM, or LONG types. There is a maximum space for dictionary entries in the new and old reference log, and a maximum allowed space in the old reference log for MEDIUM and LONG dictionary entries. This means that sometimes dictionary entries need to be deleted as previously described. Dictionary entries are deleted by changing their type to FREE.

The LIST dictionary item field 1125 indicates which of a number of doubly-linked lists the dictionary item is part of. A NEW list dictionary entry indicates that its current content is in the new reference log. In this case the list is ordered by the value of the REF LOG OFFSET. MEDIUM and LONG list values indicate the content is in the old reference log. In both case the entries are in most recently used order. Finally FREE list indicates that they are part of a free list. When dictionary entries are deleted they are returned to either the start of the FREE list if their last content was in new reference log, or the end of the FREE list if the start of their content was in the old reference log. In the latter case the REF LOG OFFSET is maintained in the FREE list dictionary entry and the same REF LOG OFFSET is re-used when a dictionary entry's content is moved from the new to the old reference log. This is possible because the old reference log is split into chunk length content.

The NEXT_DE 1126 and PREV_DE 1128 are used for maintaining the dictionary entries in doubly-linked list order as defined by the LIST field. As an example the NEXT_DE value of 1 in 1150 is the index value 1 meaning that the next entry in the new LIST is dictionary entry 1. The PREV_DE is a index value of the previous dictionary entry in the list. The value of 0 in 1152 is an example of the special value indicating this is the first dictionary entry in the list. As set forth in FIG. 12, a "dictionary lists" table 1260 maintains the first (1264), last (1266), and count (1268) for each dictionary list (1262).

Figure 6:
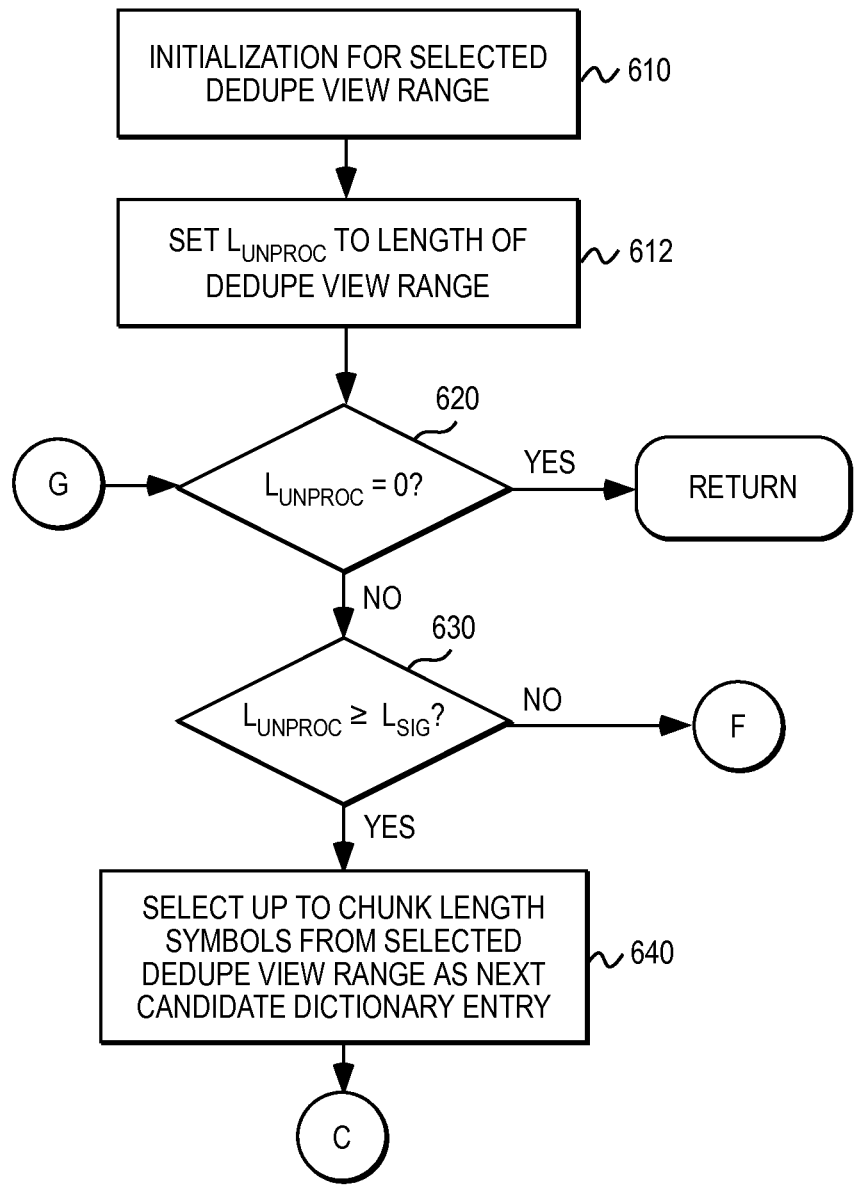
FIG. 6 illustrates one embodiment of the beginning of the detailed dedupe compression process.

Referring to FIG. 6, the dedupe process detail begins with initialization for the selected dedupe view range in step 610. A variable, $L_{UNPROC}$, representing the length of the remaining unprocessed data in the dedupe view range is set to the length of the dedupe view range in step 612. If there are no symbols left to process as determined by step 620 (i.e., $L_{UNPROC}=0$), then the dedupe process is concluded. If the number of unprocessed symbols is not greater than or equal to a pre-determined signature length, $L_{SIG}$, as determined by step 630, then a wrap-up of the current chunk is performed as set forth in FIG. 10.

If the number of unprocessed symbols is at least as long as a signature (i.e., $L_{UNPROC} \geq L_{SIG}$) as determined by step 630, then up to the next chunk length of symbols from the selected dedupe view range is selected as the next candidate dictionary entry in step 640 (a length of less than chunk length but at least signature length is chosen to search for matching signatures).

Figure 7:
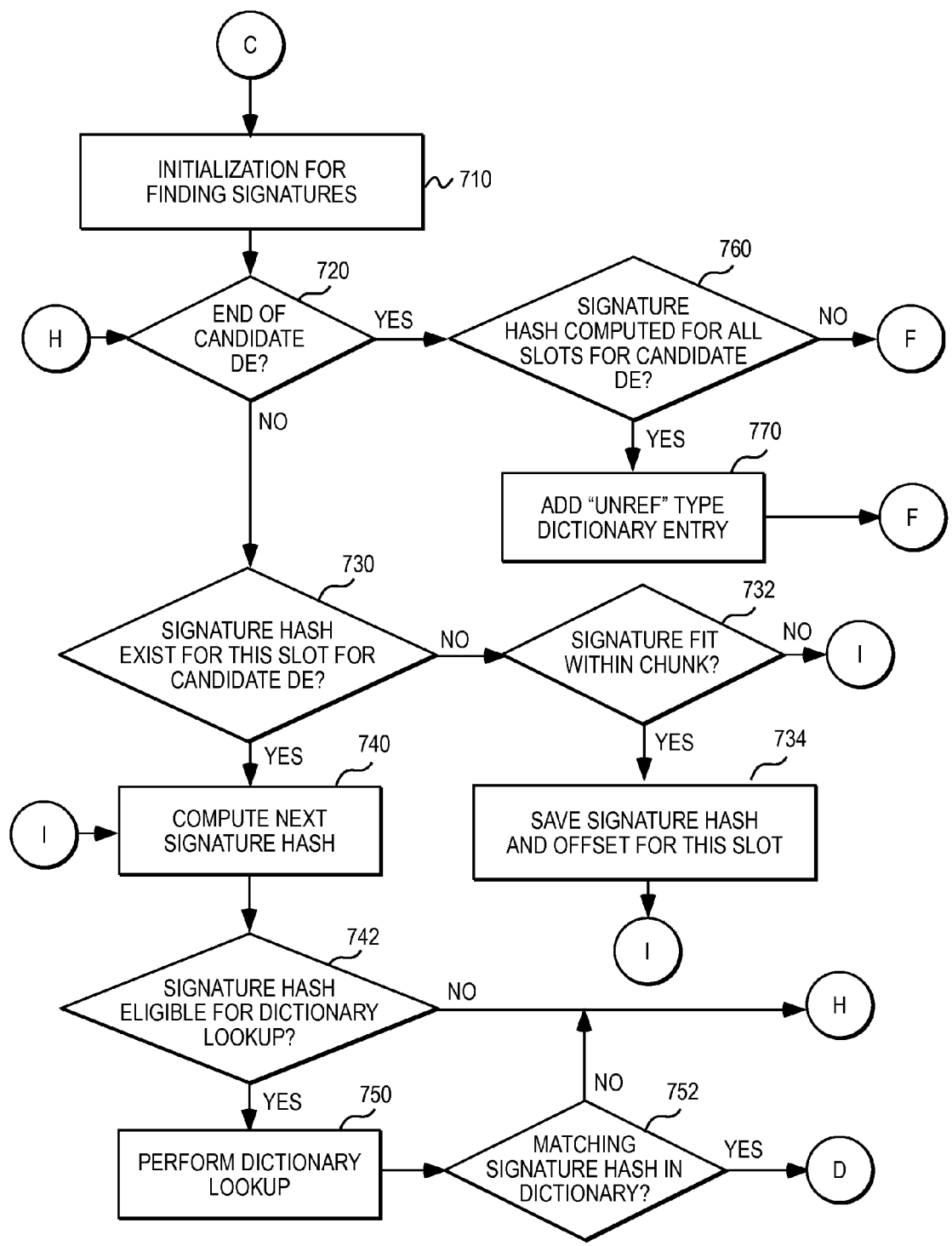
FIG. 7 illustrates one embodiment of a process for finding matching signatures for a selected chunk of data corresponding to a candidate dictionary entry.

FIG. 7 shows the detailed process for identifying a matching dictionary entry by either matching a signature starting within the selected chunk or determining there is no matching dictionary entry and using the chunk to create a new dictionary entry. The initialization for finding signatures is performed in step 710. The first $L_{SIG}$ symbols are selected as the first candidate signature and the values of SH_1 and SH_2 for this dictionary entry candidate are set as "not set" in step 710. If no matching signatures for matching content are found within the chunk length and "signature count" unique signatures are found, then a new UNREF type dictionary entry will be added using this chunk.

Step 720 determines whether processing is at the end of the selected candidate dictionary entry. This means all signatures in the dedupe view range up to the one starting at the last symbol in the candidate dictionary entry have been checked for matching an existing dictionary entry. If all signatures have been checked and a signature hash has been calculated for all slots as determined by step 760, then a UNREF type dictionary entry is added in step 770. In various embodiments, adding a new dictionary entry involves using a FREE type dictionary entry or replacing a least recently used dictionary entry from the LONG or MEDIUM list.

If processing is not at the end of the selected candidate dictionary entry, then step 730 determines whether a signature hash exists for this slot of the dictionary, where:

SIG_SLOT=mod(SIG_OFFSET, SIG_COUNT)

"mod" indicates the modulo function. Modulo returns a remainder that would result from dividing the dividend (SIG_OFFSET) by the divisor (SIG_COUNT). The dictionary allows for up to SIG_COUNT signatures to be identified for each dictionary entry. The remainder determines the slot position (SIG_SLOT) that the signature should be associated with for the dictionary entry.

If no signature hash exists processing continues to step 740. Otherwise, in step 732 a test is performed to determine whether the signature fits fully in the candidate dictionary entry. The signature fits within the candidate dictionary entry if $SIG\_OFFSET+L_{SIG} \leq L_{CHUNK}$. If the signature fits in the boundaries of the chunk for the candidate dictionary entry then the signature and its offset are saved as part of the candidate dictionary entry in step 734.

From either step 730 or step 734, processing continues with step 740. The next signature is hashed in step 740 at starting offset of a symbol after the last hashed signature for this candidate dictionary entry. When multiple signatures are used, step 740 will choose the next symbol offset that is in the first slot and will skip over signatures in other slots if a signature has already been saved for that slot. Step 740 generates a signature hash for performing a hash lookup in the dictionary. In one embodiment, the signature is hashed using a rolling checksum. A rolling checksum is relatively fast to compute because it only needs to a) add the effect of new symbols concatenated to the end of the range and b) subtract the effect of symbols removed from the beginning of the range.

In one embodiment, the dedupe process does not perform a dictionary lookup for every signature hash. Before actually performing a dictionary lookup, step 742 determines whether the signature hash is eligible for a dictionary lookup. In one embodiment, only signature hashes having certain characteristics are looked up. In one embodiment, for example, only signature hashes having a pre-determined property are permitted to be stored in the dictionary. In this case, the set of signature hashes permitted in the dictionary is a proper subset of the set of possible signature hashes for a signature length of data. The pre-determined property determines how sparsely distributed the permissible set of signature hashes is among the set of all possible signature hashes that could be computed from a signature length of data. The imposition of such a requirement upon signature hashes for the dictionary enables a reduction in the number of dictionary lookups performed.

For example, the pre-determined property might require that the signature hash begin with or end with a particular bit sequence (e.g., "111") or byte value (e.g., x03). In one embodiment, only sparse signature hashes that meet the following condition are looked up:

mod(SIG_HASH, SIG_MARKER)=0

The signature marker (SIG_MARKER) is a pre-determined value. Modulo returns a remainder that would result from dividing the signature hash (SIG_HASH) dividend by the signature marker divisor. If the signature hash is not evenly dividable by the signature marker, then a lookup will not be performed.

In another embodiment referred to previously as the "multi-signature" method, multiple signatures are maintained per dictionary entry so as to reduce the number of dictionary lookups required thereby reducing the processing time to perform deduplication at the expense of increasing the memory required to hold the same number of dictionary entries.

As an example, a modulo of the offset of the start of the signature within a chunk can be used to split the signatures into multiple slots. If, for example, a signature count of two is required then there would be two slots in the chunk, one corresponding to odd offset signatures and one corresponding to even offset signatures. In this case an odd offset signature hash and an even offset signature hash would be maintained for each dictionary entry as shown in 1115 and 1117 of FIG. 11. When new content is being checked for matching signatures then only every even offset signature need be looked up in the dictionary thus halving the number of lookups required. Since odd and even offset signature hashes are maintained in the dictionary, checking of the even offset signature hash within the new content is guaranteed to find a matching dictionary entry even if the signature entry is at an odd offset within the matching dictionary entry.

If the signature hash is eligible for lookup, then a lookup is performed in step 750. Step 752 determines whether a dictionary entry with a matching signature hash was found. If a match is found, processing continues with FIG. 8 to validate the match. If a match was not found or if no lookup is performed, then processing of the candidate dictionary entry continues with step 720.

Figure 8:
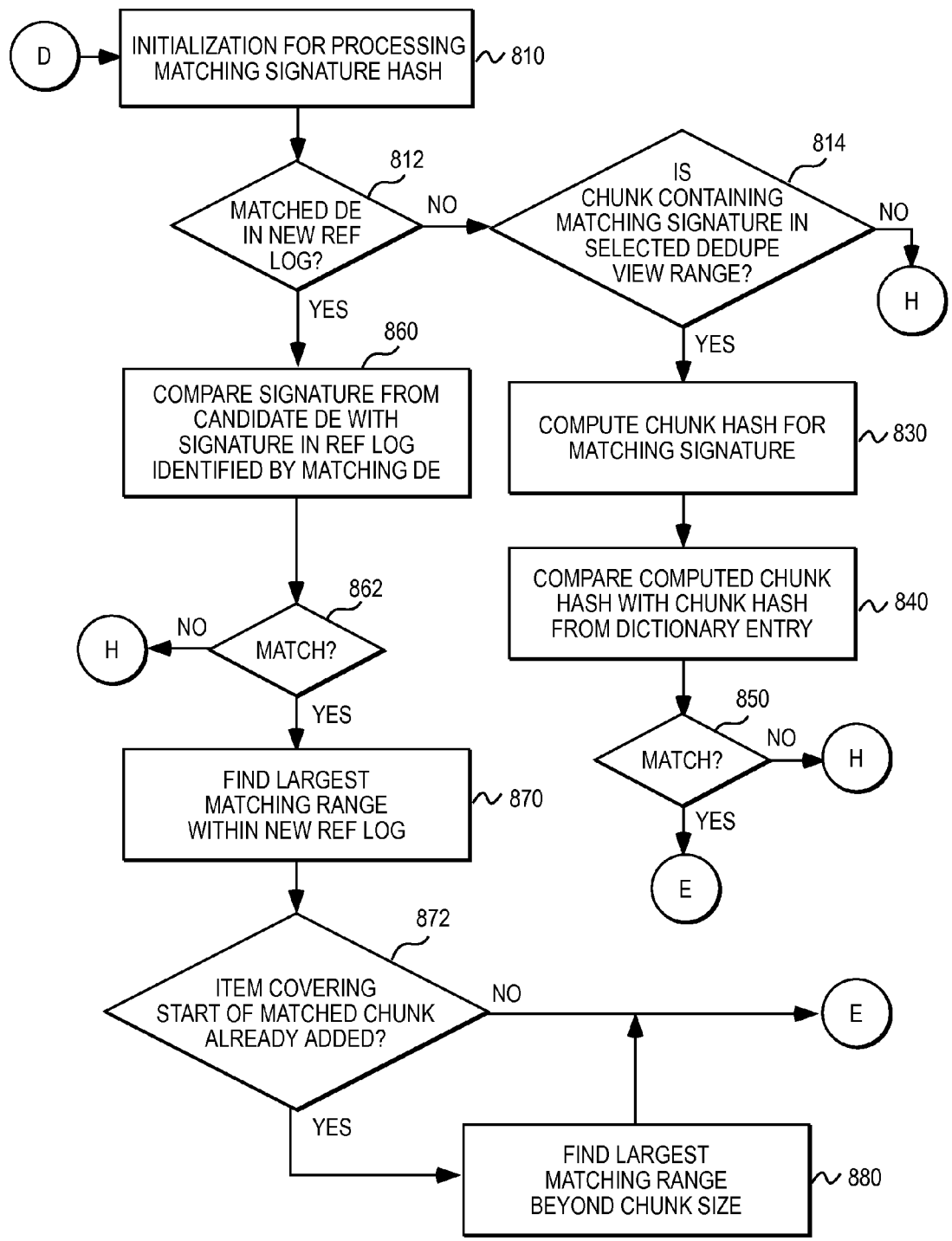
FIG. 8 illustrates one embodiment of a process for finding matching content based on the matched signatures.

FIG. 8 illustrates the portion of the dedupe process that occurs when a signature hash match is found. Hash collisions are possible. Thus a matching signature hash or dictionary "hit" does not guarantee that the signature or chunk matches. A validation of the match must be performed. A content match can be established by utilization of a stronger checksum or a symbol by symbol comparison of the signatures. However, comparison of the signatures is possible only while the data associated with the dictionary entry still resides within the new reference log.

Initialization for processing a matching signature hash is performed in step 810. Step 812 determines whether the matching dictionary entry points to a location in the new reference log by checking if part of the NEW list. If so, in step 860 the selected signature represented by the candidate dictionary entry is compared symbol by symbol to the signature in the reference log that is identified from the matching dictionary entry. If the signatures do not match as determined by step 862, then processing the candidate dictionary entry continues with step 720 in FIG. 7. Otherwise, step 870 compares the symbols before and after the two matched signatures in the new reference log to find the longest matching range around the matching signatures up to a chunk length aligned with the matching dictionary entry.

As an example, if the matching dictionary entry signature had an offset of 20 symbols from the start of the chunk, the signature was 500 symbols long and the chunk was 2000 symbols long, then step 870 would check how many of the previous 20 symbols matched and how many of the next 1480 symbols matched and find the longest matching range within these boundaries around the matched signature.

In step 872 a check is made if a DEDUPE item has already been added to the new reference log that includes the first symbol in the matched chunk. This happens when a previous matching signature found a matching range that was more than a chunk length. If the first symbol is not part of a previously added dedupe item, then processing continues in FIG. 9. Otherwise in step 880, a comparison of symbols around the matched chunk length is continued to find the longest matching range within the current dedupe view range. Having identified the longest matching range, processing continues in FIG. 9 to process the matching content.

Referring to step 812, if the matching dictionary entry points to a location in the old reference log, then a check needs to be made to determine whether the chunks corresponding to the signatures match. Step 814 uses the signature offset in the matched dictionary entry to calculate the start and end of the corresponding chunk around the matched signature in the dedupe view range within the new reference log. If both start and end are not within the dedupe view range there is no match and control passes back to step 720 of FIG. 7. If the corresponding chunk is in the dedupe view range then its chunk hash is calculated in step 830. The corresponding chunk hash is compared with the dictionary chunk hash in step 840. If a match is found as determined by step 850, then control passes to FIG. 9 to process the matching content. If there is no match then processing for the candidate dictionary entry proceeds back to step 720 of FIG. 7.

Figure 9:
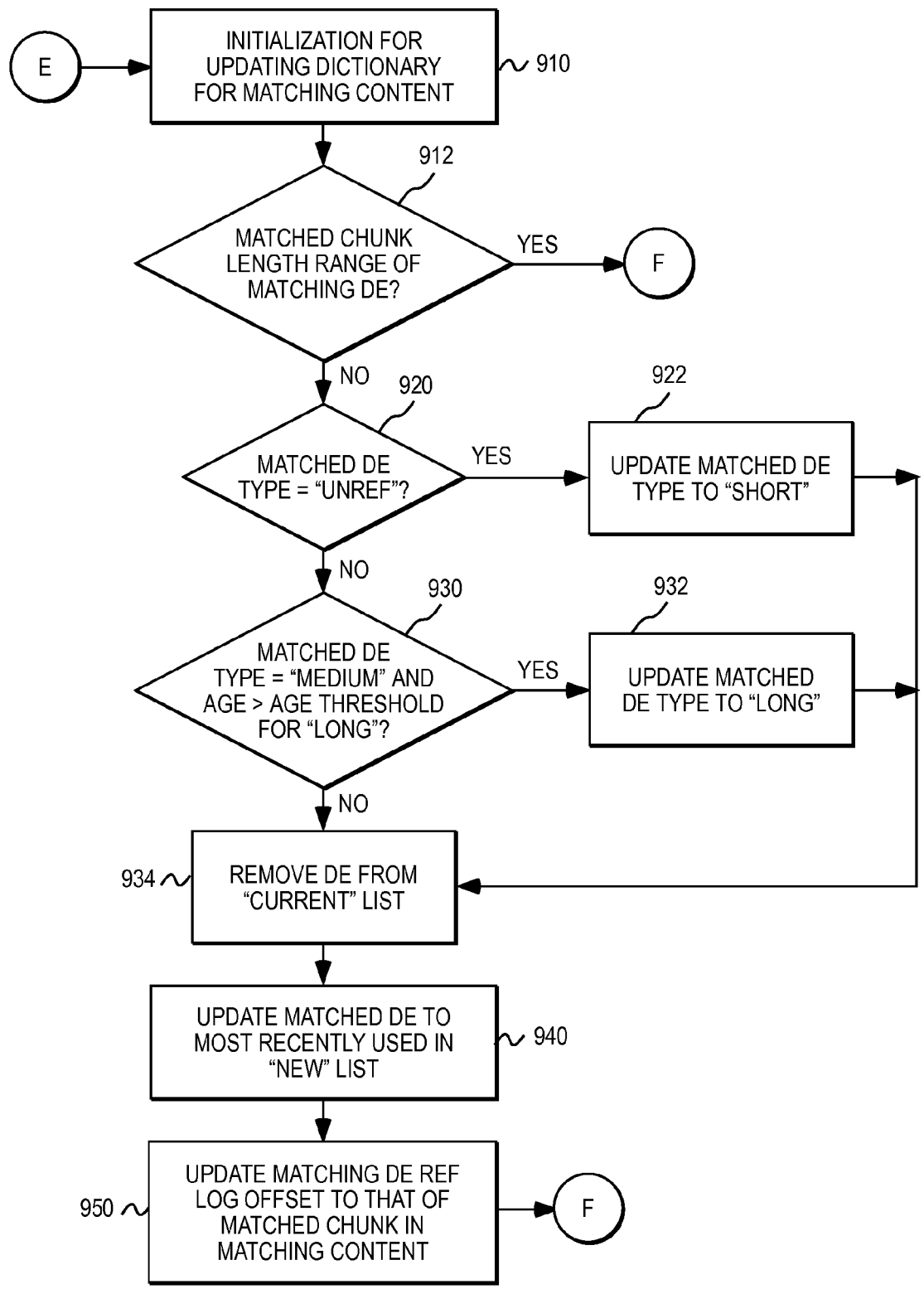
FIG. 9 illustrates one embodiment of a process for updating the dictionary due to matching content.

FIG. 9 illustrates one embodiment of updating the dictionary due to matching content. In step 910, initialization is performed for updating the dictionary due to matching content. If the matching content does not match the chunk length range within the matched dictionary entry as determined by step 912, then no further dictionary update is performed and processing for the current candidate dictionary entry wraps up in FIG. 10. This can occur, for example, when two signatures are matched in the new reference log but the size of the matched range around the signatures is less than chunk size. Otherwise the action taken depends upon the matched dictionary entry type (i.e., UNREF, SHORT, MEDIUM, LONG).

If the matched dictionary entry type is UNREF as determined by step 920, then the type is updated to SHORT in step 922. If the matched dictionary entry type is MEDIUM and the age of the dictionary entry as defined by the current time minus the time the dictionary entry was first added is greater than the age threshold to be transitioned to LONG as determined by step 930, then the type is updated to LONG in step 932.

Having made all necessary updates to the dictionary type, the dictionary entry needs to be removed from its position in the current list and re-added as the most recently used entry in the NEW list. Step 934 removes the dictionary entry from the current list and step 940 adds it into the NEW list. Step 950 updates the reference log offset in the dictionary entry to be at the start of the first matched chunk corresponding to the matched signature in the matched content. As part of step 950, where the previous reference log's offset was in the old reference log, then a dictionary entry of type FREE is used to allow the previous chunk length within the old reference log to be re-used. Processing to wrap up handling of the current candidate chunk continues in FIG. 10.

Figure 10:
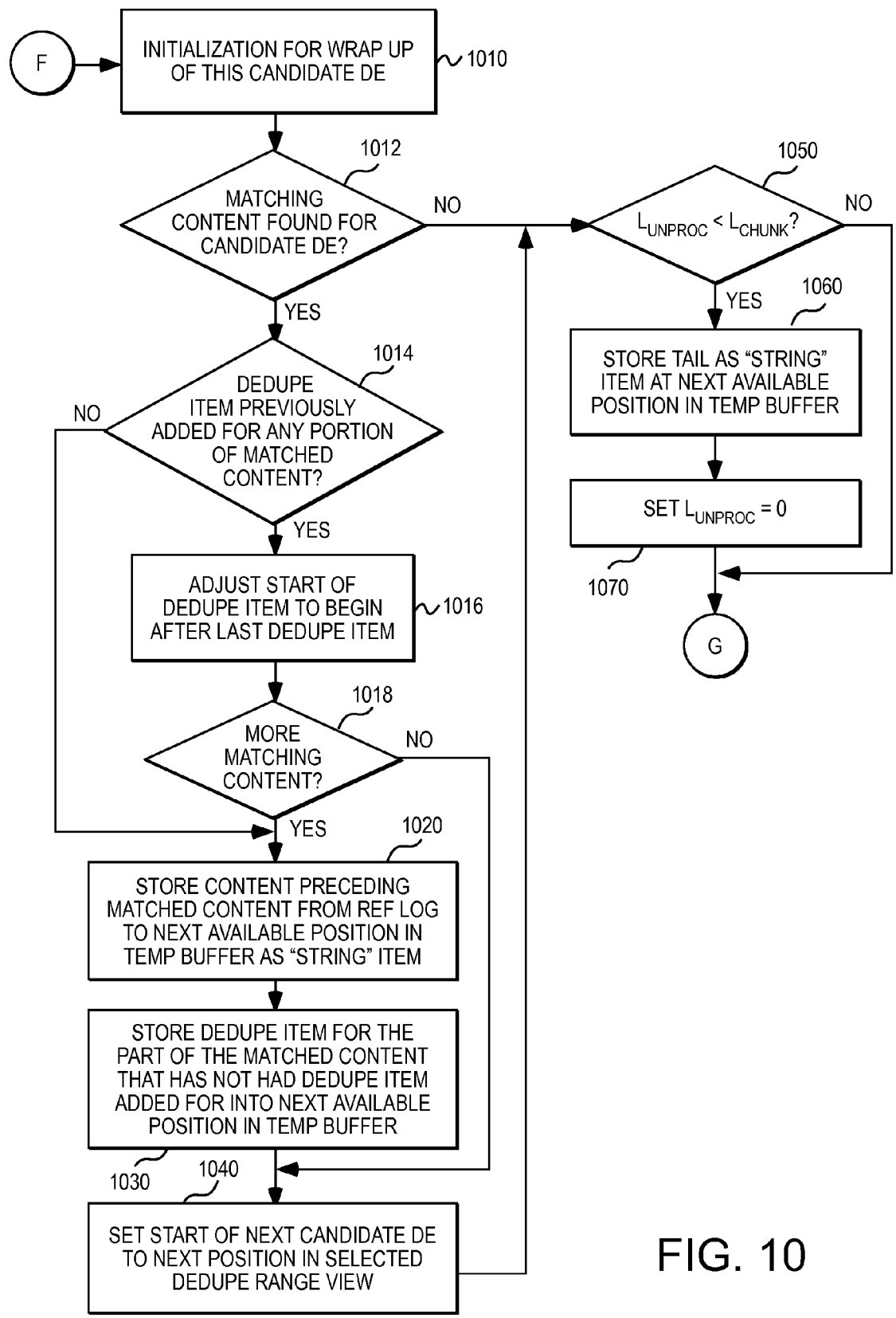
FIG. 10 illustrates one embodiment of a process for wrapping up handling of a current candidate dictionary entry.

FIG. 10 illustrates wrapping up handling of the current candidate dictionary entry beginning with initialization step 1010. If matching content was not found as determined by step 1012, then the remaining unprocessed length of the selected dedupe view range is compared to the pre-determined chunk length in step 1050. If the unprocessed data is not at least a chunk in size (i.e., if $L_{UNPROC} < L_{CHUNK}$) then there will be no further deduplication for the current dedupe view range. Accordingly in step 1060 the remainder or tail of the selected dedupe view range is stored as a STRING item at the next available position in the temporary buffer. The variable $L_{UNPROC}$ is set to zero in step 1070 to reflect that the entire dedupe view range has been processed. Processing continues in step 620 of FIG. 6.

If matching content had been found for the selected candidate chunk in step 1012, then in step 1014 a check is made to determine whether the DEDUPE item being added has already had some of its content added by the previously added DEDUPE item. This case occurs when the previous DEDUPE item was greater than a chunk in length and chunks after the first matched chunk were searched for matching signatures so as to update any additional dictionary items.

In a separate embodiment this additional checking for matching dictionary entries when a matched range is greater than a chunk length could be performed as a separate process to take advantage of multiple processors on a computer so as to reduce the elapsed time to compress the content.

If step 1014 determines that the previous DEDUPE item already has some or all of the content then the start of the new DEDUPE item to be added is moved to start at the end of the previous DEDUPE item in step 1016. Step 1018 checks whether the new DEDUPE item to be added has any content (i.e., whether any symbols remain after performing step 1016). If not then processing continues with step 1040. Where steps 1014 or step 1018 have identified that a new DEDUPE item can be added then processing continues at step 1020 where the content preceding the matched content from the new reference log is stored to the next available position in the temporary buffer as a STRING item. A DEDUPE item with a reference log offset from the matching dictionary entry as an item value is stored at the next available position in the temporary buffer in step 1030. The DEDUPE item includes the length of the previous item in the new reference log as this is needed in the redupe process to re-construct the list items in the new reference log on the target node. In step 1040 the start of the next candidate chunk is set to the next position in the selected dedupe view range. Processing then continues with step 1050 as set forth above.

Decompression at Target Node

Figure 18:
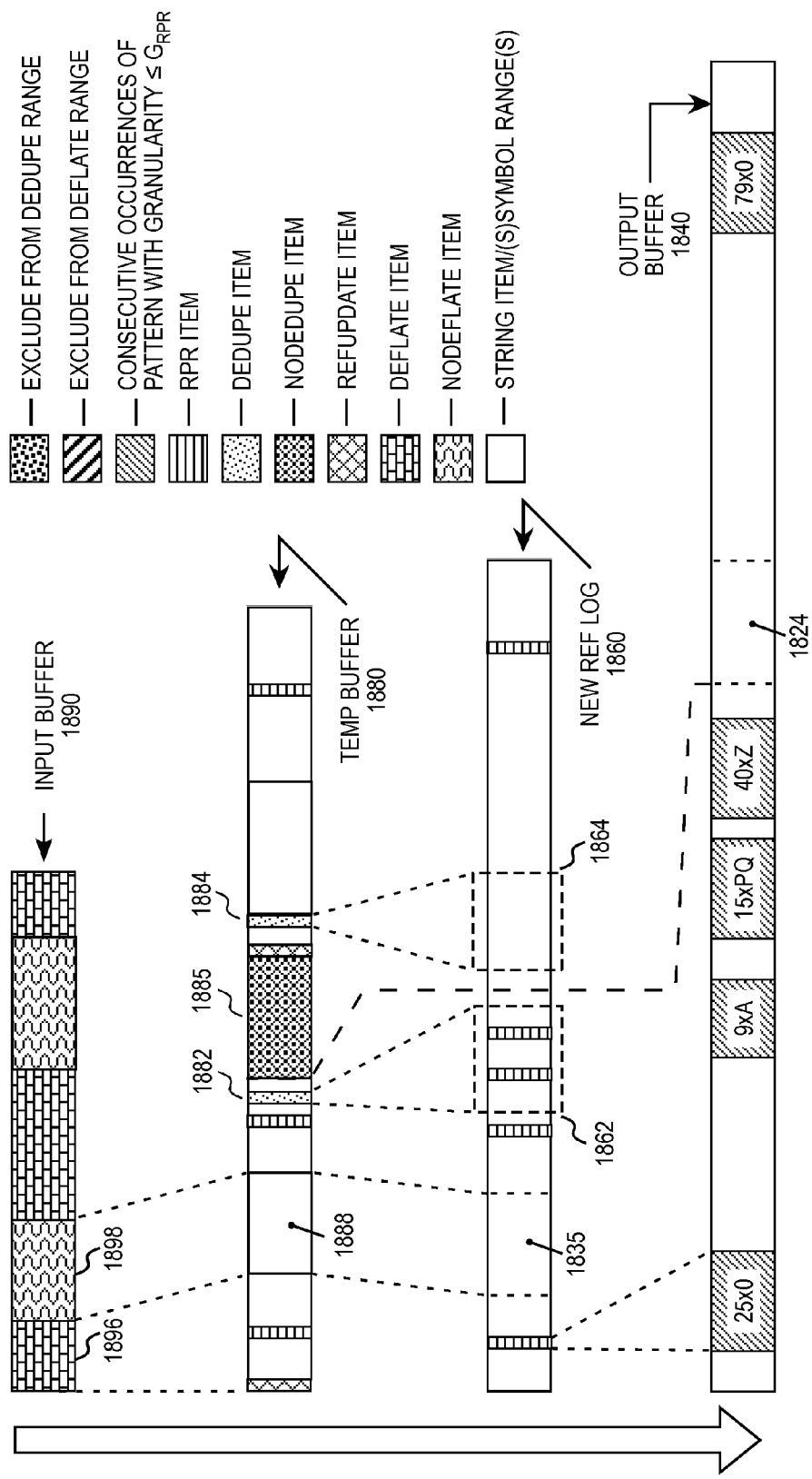
FIG. 18 illustrates one embodiment of the use of buffers during decompression.

Once the compressed data has been transferred to the target node, the data must be decompressed. FIG. 18 illustrates an overview of the process and data flows for one embodiment of the de-compression process at the target node.

The contents of the source node's output buffer we communicated to the input buffer 1890 of the target. The contents of the input buffer are inflated into the temporary buffer 1880 in order to expand any deflated item 1896 into the temporary buffer as a STRING item 1888. NODEFLATE items 1898 are copied and stored as STRING items 1888 in the temporary buffer. The target temporary buffer 1880 will reflect the prior contents of the source temporary buffer.

The contents of the target temporary buffer are processed in order as a sequence of items. A REFUPDATE item is essentially a command embedded in the compressed data to maintain the target old reference log. Upon encountering a REFUPDATE item, the target node copies the indicated ranges of the target new reference log to a location in the target old reference log. All other items are decompressed into the target new reference log 1860 or the output buffer 1840 depending upon whether the items were subject to deduplication or were excluded from dedupe (e.g., 1885) as indicated by the NODEDUPE item keyword.

A copy of the source new reference log is maintained on the target. In addition the target maintains a target old reference log that is maintaining an older history of referenced data that is only held and referenced on the target. At the source, the dictionary is used to maintain references to content in the old reference log. Accordingly, the source node only retains the new reference log.

Over time, the source dictionary is populated with patterns originating from different input buffer contents. Instead of transporting the dictionary to the target, however, the source new reference log is re-created on the target node as a target new reference log. Although the source only maintains a new reference log, the target new reference logs are migrated to a target old reference log. The new and the old reference logs are collectively referred to as the target reference log. In this manner, the target maintains both the new reference log and a history of such logs ("old reference log") for so long as necessary as to ensure that any source input buffer patterns matching content in the new or old reference log will be accessible within the target reference log.

When creating a DEDUPE item on the source node, the DEDUPE item value is the reference log offset into the target reference log for the location of the original symbols. The reference log offset may identify a range in either the new reference log or the old reference log. In various embodiments, the target new reference log may be implemented as a circular buffer. Portions of the new reference log are copied to the old reference log, as defined by REFUPDATE items inserted by the source node, in order to preserve the ability to access the original data while keeping the new reference logs synchronized between the source and target nodes.

Generally, other than REFUPDATE and NODEDUPE items, items other than DEDUPE items are copied from the temporary buffer "as is" to the new reference log in order. Specifically STRING 1835 and RPR items are copied "as is". DEDUPE items 1882, 1884, however, are decompressed (e.g., 1862, 1864) into the new reference log. The DEDUPE item is a token pointing to data that has previously been received. Instead of copying the token to the new reference log, the data referenced by the DEDUPE item is copied to the new reference log "as is" from the reference log location indicated by the DEDUPE item-value. The item-value of NODEDUPE items 1885 are copied to the output buffer 1890 (e.g., 1824) as they are encountered when processing the temporary buffer contents.

The contents of the target new reference log are decompressed into a target output buffer 1840 by expanding the RPR items and by extracting the item-value of STRING items. The contents of the output buffer are then processed by performing the indicated write operations to storage on the target node.

Figure 19:
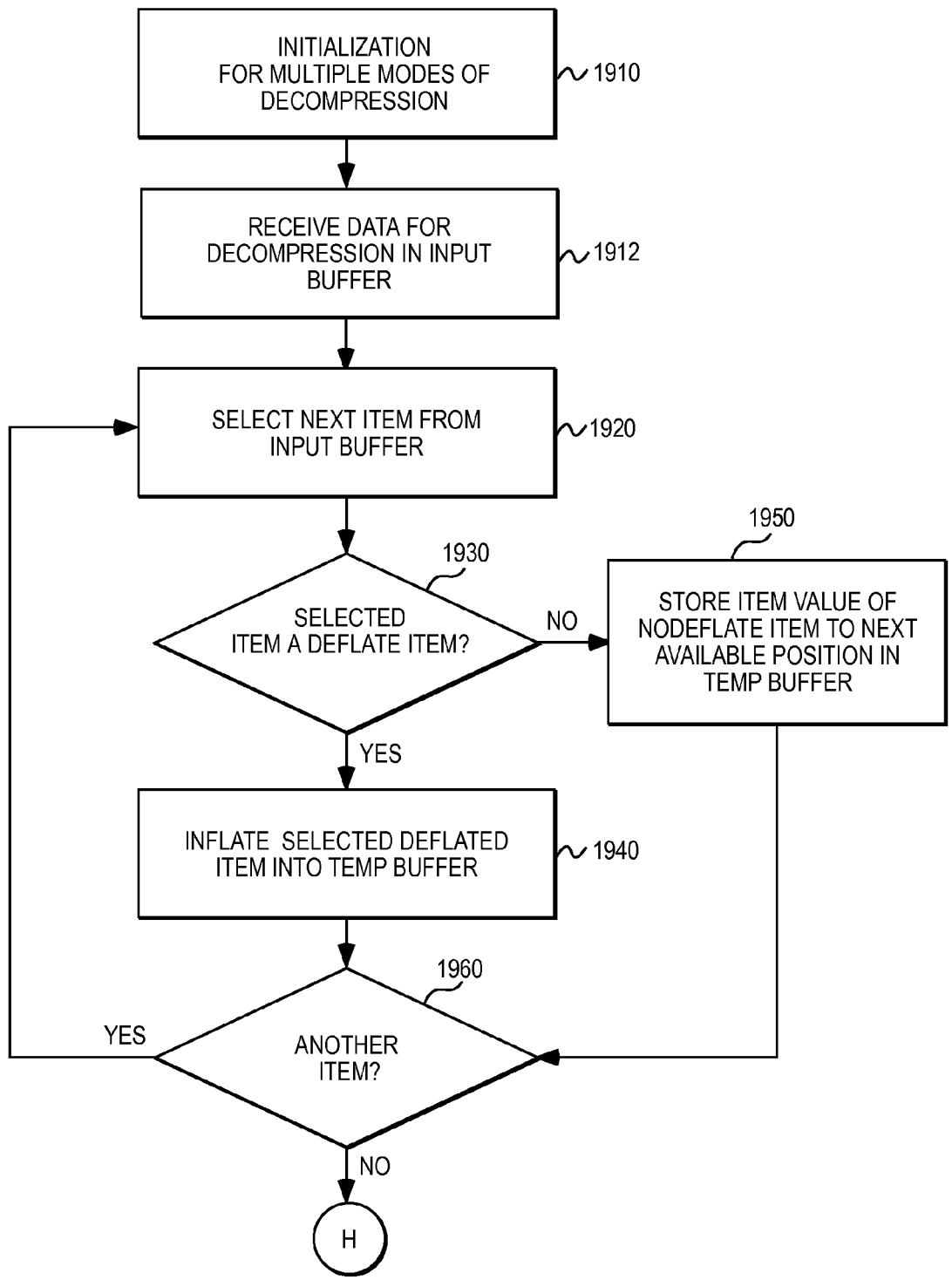
FIG. 19 illustrates one embodiment of a process for performing multiple modes of decompression including inflation on data contained in an input buffer.
Figure 20:
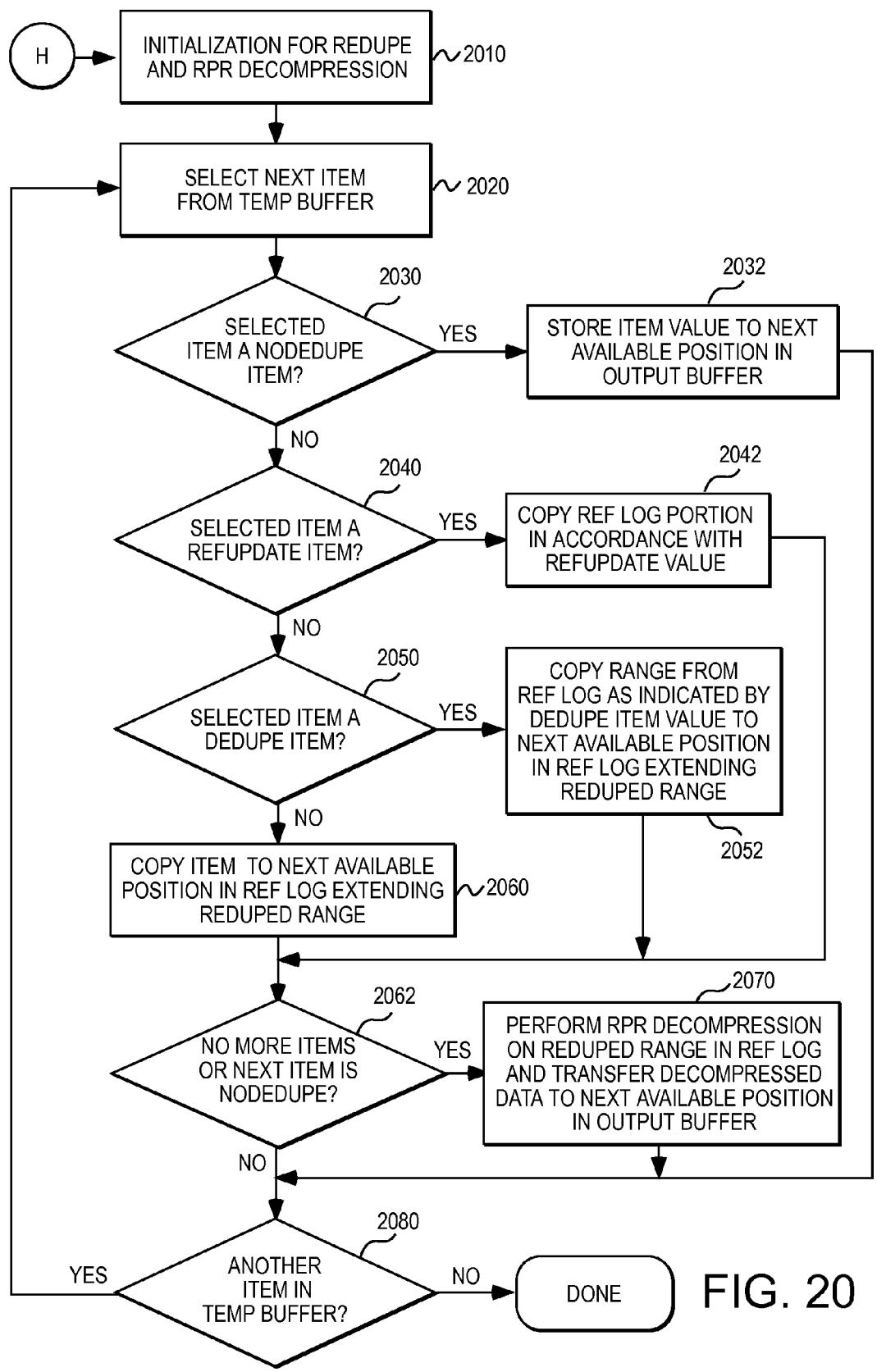
FIG. 20 illustrates one embodiment of a process for performing multiple modes of decompression including RPR decompression and reduplication.

FIGS. 19 and 20 illustrate one embodiment of the process for decompressing the input buffer received by the target node. FIG. 19 illustrates the deflation decompression (i.e., "inflation") and FIG. 20 performs reduplication and RPR decompression.

FIG. 19 illustrates one embodiment of inflation. In step 1910, initialization for decompression is performed. The source compressed data is received into a target input buffer in DEFLATE and NODEFLATE item-list form in step 1912.

The next item is selected from the input buffer in step 1920. If the selected item is not a DEFLATE item as determined by step 1930, then the selected item is a NODEFLATE item. The value of the NODEFLATE item is copied to the next available position within a target temporary buffer in step 1950.

If the selected item is a DEFLATE item, then the item value of the selected DEFLATE item is inflated into the next available position within the temporary buffer in step 1940. This entails performing an inflate operation on the string value associated with the DEFLATE keyword.

After handling the DEFLATE or NODEFLATE item, processing continues with step 1960. If there is another DEFLATE or NODEFLATE item as determined by step 1960, then the process continues with step 1920 to select the next item. Otherwise, deflation decompression is completed.

FIG. 20 illustrates one embodiment of the deduplication decompression (i.e., "redupe") and RPR decompression process beginning with initialization in step 2010. The deduplication decompression generally only requires expansion of DEDUPE items when such items are encountered.

Starting from the current position in the temporary buffer, the next item is selected from the temporary buffer in step 2020. If the selected item is a NODEDUPE item as indicated by keyword as determined by step 2030, then the item value of the NODEDUPE item is written to the next available position in the target output buffer in step 2032.

If the selected item is a REFUPDATE item as determined by step 2040, then the identified new reference log portion is copied to the old reference log in accordance with the REFUPDATE item value in step 2042.

Step 2050 determines whether the selected item is a DEDUPE item. If so, then a range of symbols is copied from the old or new reference log as indicated by the DEDUPE item to the next available position in the new reference log in step 2052. As part of this step the length of the previous item in the new reference log, if there is one, is adjusted. This is done using a 'last item before length' that is stored in the DEDUPE item.

If the selected item is none of a NODEDUPE, REFUPDATE, or DEDUPE item, then the item is copied from the temporary buffer to the next available position in the new reference log in step 2060.

From steps 2042, 2052, or 2060, the process continues with step 2062. At this point, the current item in the temporary buffer has been processed or its content moved to the new reference log. Step 2062 then checks if there is a next item in the temporary buffer and if there is it checks if it is a NODEDUPE item. If there is no next item or if the next item is a NODEDUPE item this means all of the items in the current dedupe view range in the temporary buffer have been processed. Thus RPR decompression is then performed on the reduped range to store source data at the next available position in the output buffer in step 2070. This process continues as long as there are items to be processed in the temporary buffer as determined by step 2080.

Figure 21:
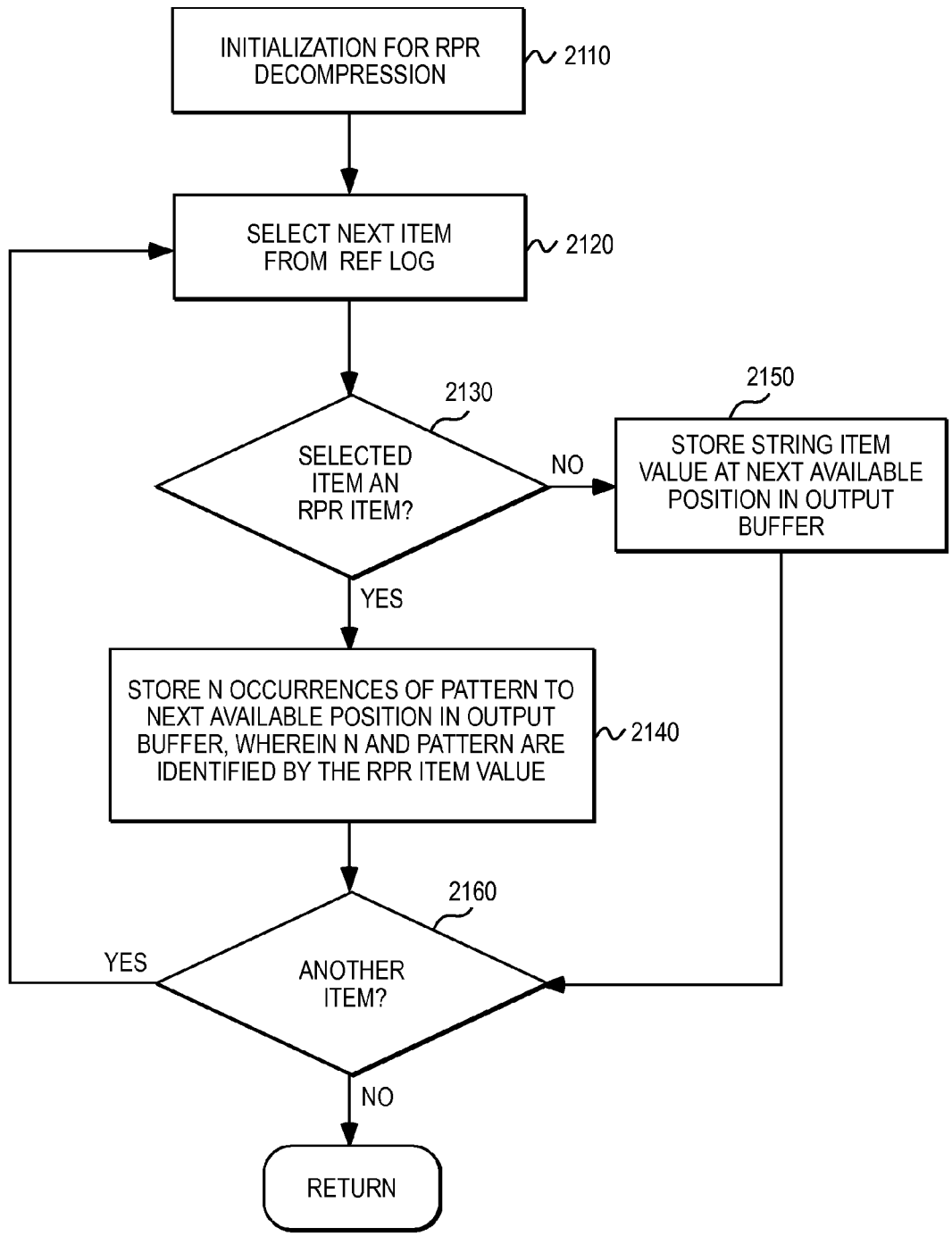
FIG. 21 illustrates one embodiment of performing RPR decompression on the new reference log to recover the source node data into the target node output buffer.

FIG. 21 illustrates the RPR decompression process of step 2070 in greater detail. Step 2110 initializes the process by selecting the start of the list of items that have been transferred for the current dedupe view range from the temporary buffer to the new reference log. This list may consist of any combination of RPR and STRING items, The next item is selected from the reference log in step 2120. If the selected item is not an RPR item as determined by step 2130, then the item is a STRING item. The item value of the STRING item is stored to the next available position in the output buffer in step 2150. Otherwise, if the item is an RPR item then N occurrences of a pattern are written to the next available position in the output buffer in step 2140. The value for N and the pattern are identified by the RPR item value. The RPR decompression process continues as long as another item remains in the reference log as determined by step 2160.

Figure 22:
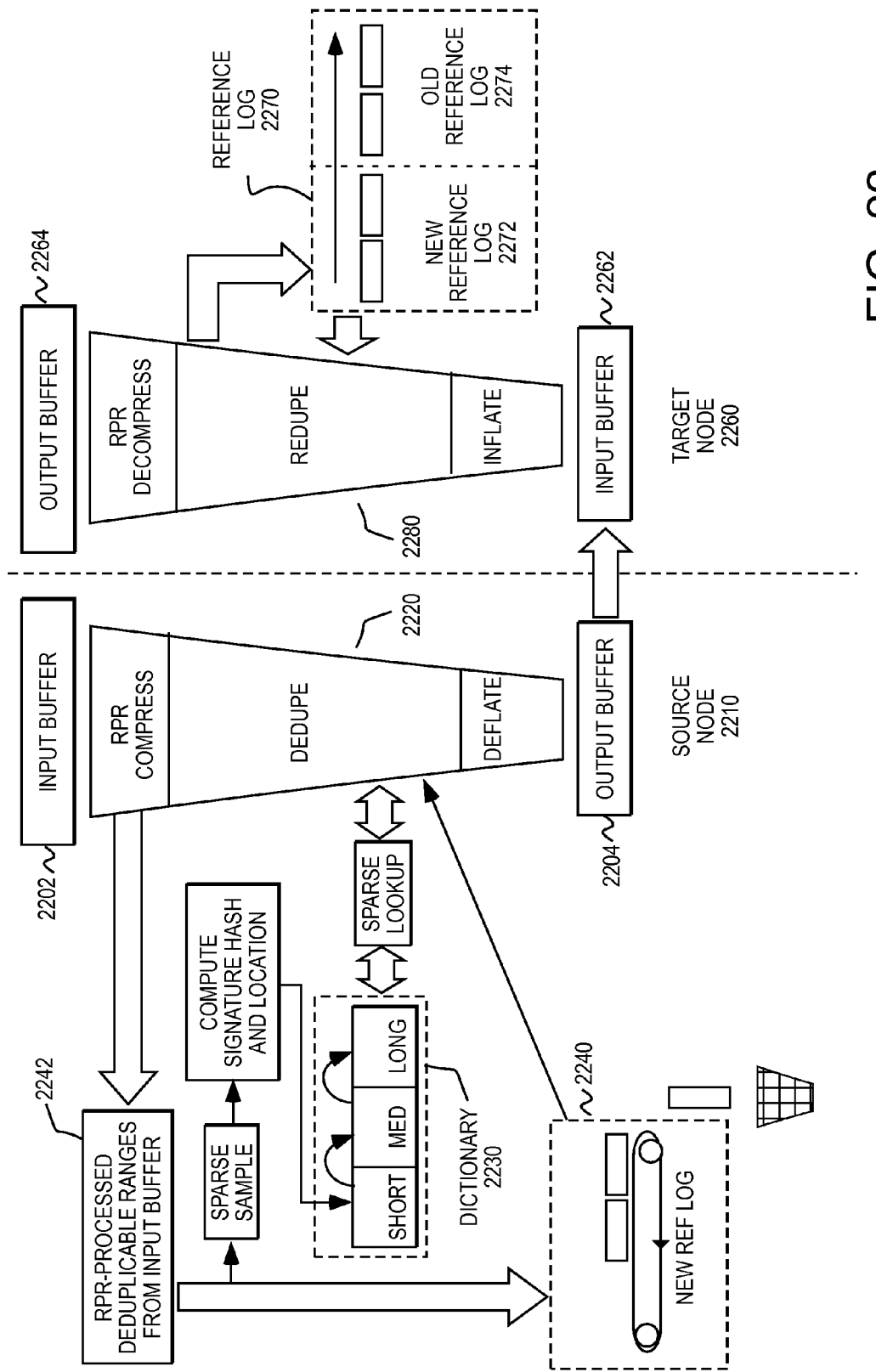
FIG. 22 illustrates one embodiment of the overall compression, transmission, and decompression process.

FIG. 22 illustrates one embodiment of the overall compression, transmission, and decompression process. The source node 2210 includes a compression engine 2220 executing on the source node. Data to be compressed is provided in input buffer 2202 and the compression engine provides the compressed data in item-list form in output buffer 2204 for communication to target node 2260.

An RPR compressed excerpt of the input buffer containing only deduplicable ranges is extracted 2242 for each instance of the input buffer data. This information is sparsely sampled and a signature hash and location of the sample are used to seed a dictionary 2230. The dictionary is used to sparsely lookup signature hash values from samples of RPR-processed deduplicable ranges at a later point in time by the dedupe compression process. In this fashion, deduplication performs a cross-correlation between historical samples of the deduplicable ranges from the input buffer data and samples of deduplicable data from the current instance of the input buffer. Successful matches over time result in promoting the seeded dictionary values to new categories to ensure that values tending to recur over time persist in the dictionary.

The RPR-processed deduplicable ranges are maintained in a new reference log 2240 which is a circular buffer such that once capacity is reached the oldest contents are overwritten with new RPR-processed deduplicable ranges. The overwritten material is thus discarded.

The compression engine utilizes the new reference log to aid in maintaining the dictionary as well as to eliminate false positive matches due to hash collisions. After RPR, and deduplication compression, the results are submitted for deflation compression and output into output buffer 2204.

The contents of the source node output buffer are communicated to the input buffer 2262 on the target node 2260. A decompression engine 2280 operates on the contents of the input buffer to re-create the source data as it existed prior to the multiple modes of compression.

An inflate operation restores the data to its pre-deflate state as it existed on the source. At this point the partially decompressed data resides in a temporary buffer on the target node. The contents of the temporary buffer are processed in the order of occurrence based upon the type of items they represent.

REFUPDATE items cause the target node to copy portions of the target new reference log to the target old reference log 2274. STRING and RPR items are copied as-is to the next available positions in the target new reference log. DEDUPE items are de-compressed into the target new reference log 2272 using the reference log 2270 to transform the DEDUPE item into the range of symbols that the DEDUPE item was used to represent. The DEDUPE item item-value provides the offset and length of the range of symbols that should be substituted from the reference log. NODEDUPE items are transferred as-is to the target output buffer 2264.

The contents of the target new reference log are processed in order and decompressed into the target node output buffer 2264. RPR items are expanded into the consecutive sequence of repeating patterns that they represent. The STRING items are converted into original source data form by extracting the item-value into the target output buffer. The contents of the output buffer are then handed to the operating system that processes the file input/output instructions and content from the output buffer.

Although the examples are illustrated with a single input buffer for purposes of explanation, the data to be compressed may be processed in piecemeal fashion with successive presentations of one input buffer. Each input buffer of data is referred to as an "instance" of input buffer data.

Figure 23:
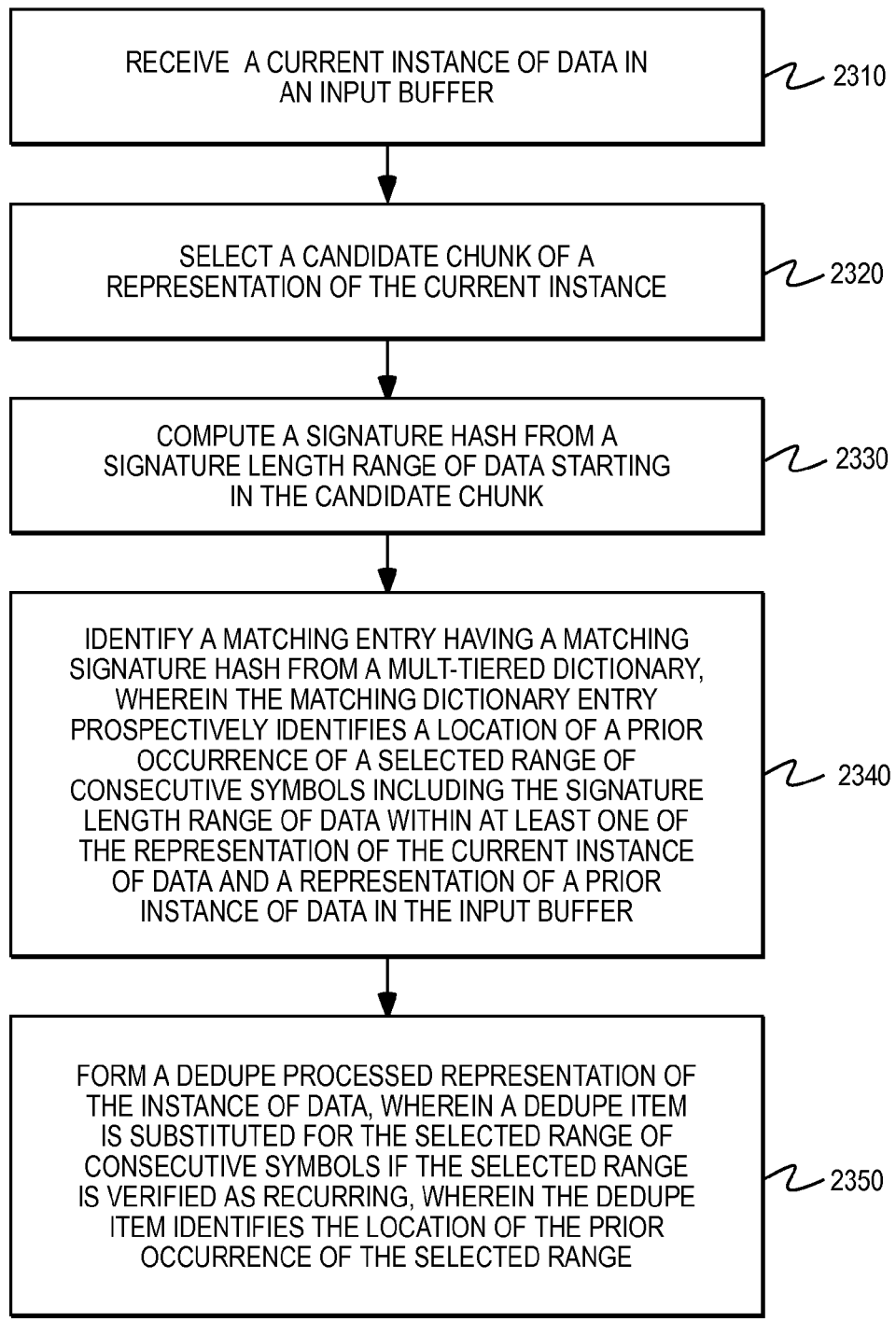
FIG. 23 illustrates one embodiment of a compression process as applied across successive instances of input buffer data.

FIG. 23 illustrates one embodiment of a compression process as applied across successive instances of input buffer data. In step 2310, a current instance of data is received in an input buffer. A candidate chunk of a representation of the current instance is selected in step 2320. The representation may be identical to the current instance of data. Alternatively, the representation may be a compressed representation of the data. Subjecting the data to RPR processing, for example, results in a representation of the input buffer. The representation need not be a complete representation of the current instance. Some ranges of the data may be excluded from deduplication, for example, as previously described.

In step 2330, a signature hash is computed from a signature length range of data that starts in the candidate chunk. In step 2340, a matching data entry having a matching signature hash is identified from a multi-tiered dictionary. The matching dictionary entry prospectively identifies a location of a prior occurrence of a selected range of consecutive symbols including the signature length range of data. The location is within at least one of the representation of the current instance of data and a representation of a prior instance of data in the input buffer.

In step 2350, a dedupe processed representation of the instance of data is formed. This entails substituting a dedupe item for the selected range of consecutive symbols, if the selected range is verified as recurring. The dedupe item identifies the location of the prior occurrence of the selected range.

Figure 24:
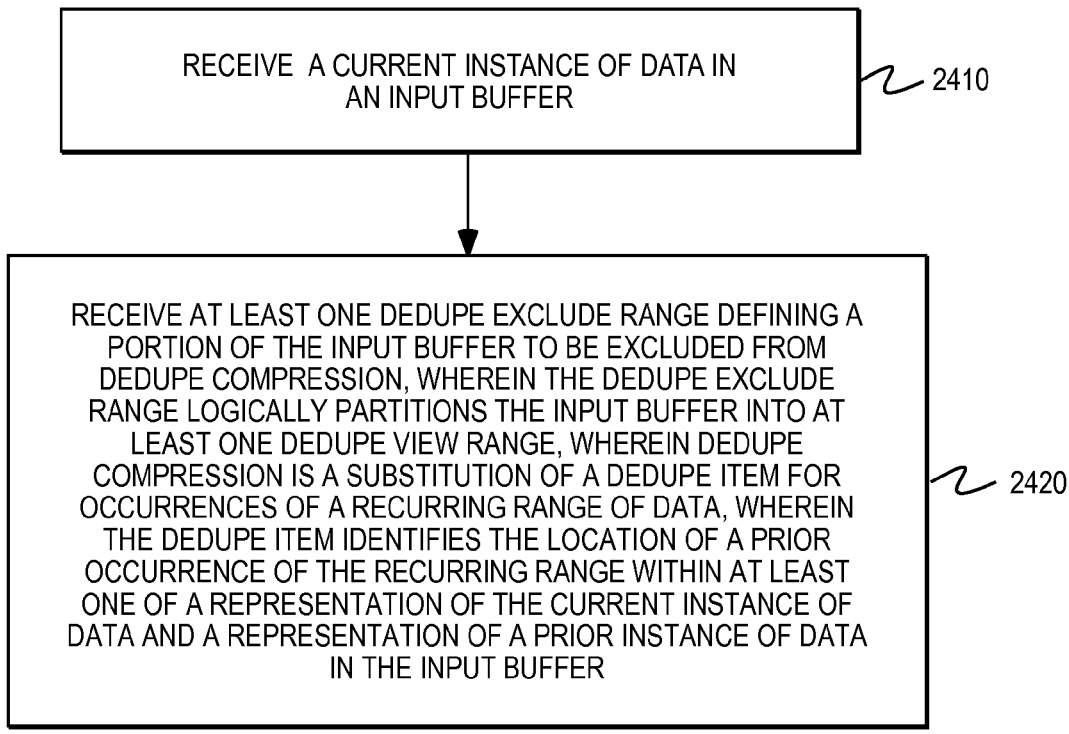
FIG. 24 illustrates one embodiment of a compression process specifically incorporating dedupe exclude ranges and multiple instances of input data.

FIG. 24 illustrates one embodiment of a compression process specifically incorporating dedupe exclude ranges and multiple instances of input buffer data. A current instance of data is received in an input buffer in step 2410. At least one dedupe exclude range defining a portion of the input buffer to be excluded from dedupe compression is received in step 2420. The dedupe exclude range logically partitions the input buffer into at least one dedupe view range. The dedupe compression is a substitution of a dedupe item for non-consecutive occurrences of a recurring range of data. The dedupe item identifies the location of a prior occurrence of the recurring range within at least one of a representation of the current instance of data and a representation of a prior instance of data in the input buffer.

Figure 25:
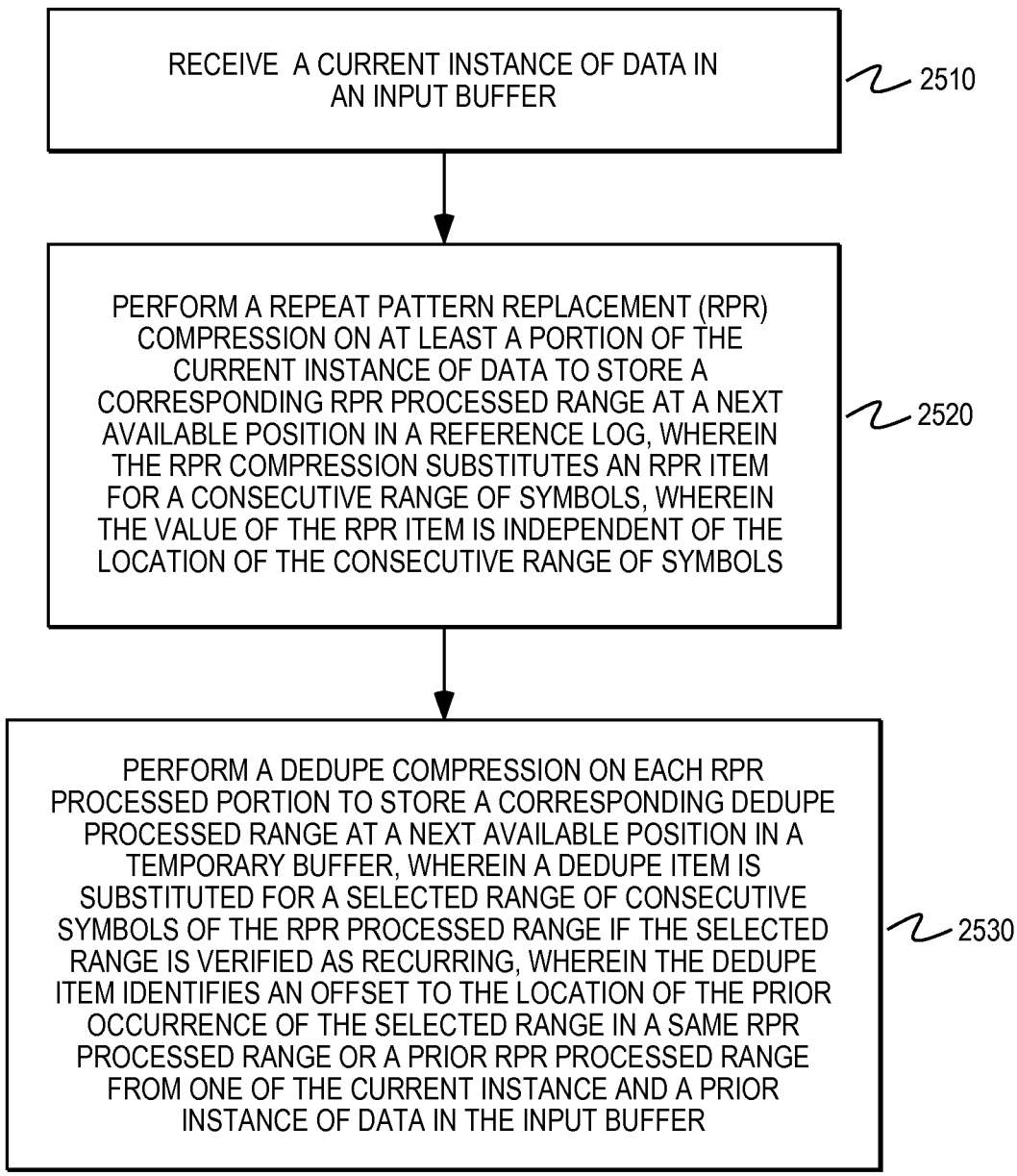
FIG. 25 illustrates one embodiment of a compression process specifically incorporating multiple instances of input buffer data wherein an RPR compression is performed prior to a dedupe compression.

FIG. 25 illustrates one embodiment of a compression process specifically incorporating multiple instance of input buffer data wherein an RPR compression is performed prior to a dedupe compression. In step 2510, a current instance of data is received in an input buffer. In step 2520, a repeat pattern replacement (RPR) compression is performed on at least a portion of the current instance of data to store a corresponding RPR processed range at a next available position in a reference log. The RPR compression substitutes an RPR item for a consecutive range of symbols. The value of the RPR item is independent of the location of the consecutive range of symbols.

For example, in the case of adjacent consecutive recurrences of a symbol pattern, the RPR compression might replace such a range of symbols with an RPR item that identifies the pattern and the number of recurrences. Other patterns (e.g. patterns anticipated due to the characteristics of the application programs from which the data originates) might simply be replaced with an RPR item that identifies the pattern with a shorter sequence of symbols or a reference to a pre-determined list of anticipated patterns. In any of these cases, the encoding for the RPR item is independent of the position of the RPR item within the buffer or range of data being compressed.

In step 2530, a dedupe compression is performed on each RPR processed portion to store a corresponding dedupe processed range at a next available position in a temporary buffer. This entails substituting a dedupe item for a selected range of consecutive symbols of the RPR processed range, if the selected range is verified as recurring. The dedupe item identifies an offset to the location of the prior occurrence of the selected range in a same RPR processed range or a prior RPR processed range from one of the current instance and a prior instance of data in the input buffer.

Other aspects of the multiple modes of compression may similarly be explicitly described in terms of the possibility of multiple instances of input buffer data. In various embodiments, these different aspects may be performed alone or in combination with each other.

In the preceding detailed description, the invention is described with reference to specific exemplary embodiments thereof. Various modifications and changes may be made thereto without departing from the broader scope of the invention as set forth in the claims. The specification and drawings are, accordingly, to be regarded in an illustrative rather than a restrictive sense.

What is claimed is:

1. A computer-implemented method of compressing data, comprising carrying out steps of the computer-implemented method by a computer system with at least a processor and a memory, the computer-implemented steps of the method including:
   a) receiving a current instance of data in memory comprising an input buffer;
   b) selecting a candidate chunk of a representation of the current instance from the input buffer;

c) computing by the processor a signature hash from a signature length range of data starting in the candidate chunk;
d) identifying a matching dictionary entry stored in memory having a matching signature hash from a multi-tiered dictionary, wherein the matching dictionary entry prospectively identifies a location of a prior occurrence of a selected range of consecutive symbols including the signature length range of data within at least one of the representation of the current instance of data and a representation of a prior instance of data in the input buffer;
e) computing a dedupe processed representation of the instance of data in the input buffer, wherein a dedupe item is substituted for the selected range of consecutive symbols if the selected range is verified as recurring, wherein the dedupe item identifies the location of the prior occurrence of the selected range; and
f) making the dedupe processed representation of the instance of data available for communication to a target computer.

2. The computer-implemented method of claim 1 wherein the dictionary entries are typed to enable varying levels of persistence of entries within the dictionary.

3. The computer-implemented method of claim 1 wherein the dictionary entries are typed to enable varying levels of match verification.

4. The computer-implemented method of claim 1 wherein the dictionary entries are typed to enable persistence based upon proximity to the current instance of data.

5. The computer-implemented method of claim 1 wherein the dictionary entries are typed to enable persistence based upon frequency of recurrence.

6. The computer-implemented method of claim 1 wherein the dictionary entries are typed to enable persistence based upon length of time since initial matched occurrence.

7. The computer-implemented method of claim 1 wherein the verification of recurrence of step e) includes the step of performing by the processor a symbol by symbol comparison of the selected range and the prospective prior occurrence of the selected range.

8. The computer-implemented method of claim 1 wherein the selected range of step d) is a longest recurring selected range of consecutive symbols containing the signature length range as determined in accordance with the dictionary.

9. The computer-implemented method of claim 1 wherein the verification of recurrence of step e) includes the step of comparing by the processor a chunk hash from the prospective matching dictionary entry with a chunk hash computed from the selected range.

10. The computer-implemented method of claim 9 wherein a location of the selected range is determined by the processor by offset to the signature length range of data, wherein the offset is a same offset identified in the matching dictionary entry for the matching signature hash and associated prospective prior occurrence.

11. The computer-implemented method of claim 9 wherein each chunk hash is a cyclic redundancy check performed by the processor.

12. The computer-implemented method of claim 1 further comprising:
g) updating by the processor the dictionary wherein a type of the matching dictionary entry is modified to increase a likelihood of persistence of a dictionary entry having that matching signature hash.

13. The method of claim 1 further comprising:
g) updating by the processor the matching dictionary entry to increase a likelihood of persistence of a dictionary entry having the matching signature hash within the dictionary, wherein the matching dictionary entry is updated to change the location associated with the prior occurrence to the location of the selected range.

14. The computer-implemented method of claim 1 further comprising:
g) performing by the processor a deflate compression on at least a portion of data resulting from step e).

15. The method of claim 14 wherein the deflate compression comprises:
i) performing by the processor a sliding window compression wherein a recurrence of a pattern within the window is replaced with a length-distance pair identifying a prior occurrence of the pattern within the sliding window; and
ii) performing by the processor entropy encoding on the sliding window compressed deflate view range to form a deflate processed representation of the dedupe processed representation of the instance of data within the input buffer.

16. The computer-implemented method of claim 1 wherein the dictionary includes only signature hashes having a pre-determined property such that the set of signature hashes stored in the dictionary is a proper subset of the set of possible signature hashes for a signature length of data.

17. The computer-implemented method of claim 1 wherein the dictionary includes only signatures having the property that mod(signature hash, signature marker) equals a pre-determined value, wherein signature marker is a pre-determined value.

18. The computer-implemented method of claim 1 wherein the dictionary provides a single signature hash per dictionary entry.

19. The computer-implemented method of claim 1 wherein the dictionary provides for a plurality of signature hashes per associated dictionary entry.

20. The computer-implemented method of claim 1 wherein the dictionary provides a signature count number of signature hash and offset pairs for dictionary entries, wherein each signature hash for a given dictionary entry is associated with a unique remainder as determined from mod (signature hash, signature count).

21. A computer-implemented method of compressing data, comprising carrying out steps of the computer-implemented method by a computer system with at least a processor and a memory, the computer-implemented steps of the method including:
a) receiving a current instance of data in memory comprising in an input buffer;
b) receiving at least one dedupe exclude range defining a portion of the input buffer to be excluded from dedupe compression, wherein the dedupe exclude range logically partitions the input buffer into at least one dedupe view range, wherein dedupe compression processing is a substitution of a dedupe item for occurrences of a recurring range of data, wherein the dedupe item identifies the location of a prior occurrence of the recurring range within at least one of a representation of the current instance of data and a representation of a prior instance of data in the input buffer; and
c) performing by the processor the following steps for each selected dedupe view range eligible for dedupe compression:
i) performing a repeat pattern recognition (RPR) compression on the selected dedupe view range to store a corresponding RPR processed range at a next available position in a reference log; and ii) performing a dedupe compression on each RPR processed range to store a corresponding dedupe processed range at a next available position in a temporary buffer; and iii) making the reference log available for communication to a target computer.

22. The computer-implemented method of claim 21 further comprising:

b) (i) storing the selected dedupe view range as a NODEDUPE item at a next available position of a temporary buffer for each selected dedupe view range ineligible for dedupe compression.

23. The computer-implemented method of claim 21 wherein c) (ii) comprises substituting a dedupe item for at least one selected recurring range of the RPR processed range, wherein the dedupe item identifies an offset to a prior occurrence of the selected recurring range.

24. The computer-implemented method of claim 21 wherein the RPR compression processing substitutes an RPR item for a consecutive range of symbols within the selected dedupe view range, wherein the value of the RPR item is independent of the location of any prior occurrence of the consecutive range of symbols within the selected dedupe view range or any previously selected dedupe view range.

25. The computer-implemented method of claim 21 wherein if the consecutive range of symbols comprises a number of adjacent recurrences of a pattern, the RPR item identifies the pattern and number of recurrences of the pattern.

26. A computer-implemented method of compressing data, comprising carrying out steps of the computer-implemented method by a computer system with at least a processor and a memory, the computer-implemented steps of the method including:

a) receiving a current instance of data in memory comprising an input buffer;

b) performing by the processor a repeat pattern replacement (RPR) compression on at least a portion of the current instance of data to store a corresponding RPR processed range at a next available position in a reference log, wherein the RPR compression processing substitutes an RPR item for a consecutive range of symbols, wherein the value of the RPR item is independent of the location of the consecutive range of symbols; and c) performing by the processor a dedupe compression on each RPR processed portion to store a corresponding dedupe processed range at a next available position in a temporary buffer, wherein a dedupe item is substituted for a selected range of consecutive symbols of the RPR processed range if the selected range is verified as recurring, wherein the dedupe item identifies an offset to the location of the prior occurrence of the selected range in a same RPR processed range or a prior RPR processed range from one of the current instance and a prior instance of data in the input buffer;

d) making the reference log available for communication to a target computer.

27. The computer-implemented method of claim 26 wherein at least one offset identifies a prior occurrence of the selected range from the prior instance of data in the input buffer.

28. The computer-implemented method of claim 26 wherein at least one offset identifies a prior occurrence selected range in the current instance of data in the input buffer.

29. The computer-implemented method of claim 26 further comprising:

e) processing deflate compression on the dedupe processed range.

30. The computer-implemented method of claim 26 further comprising:

e) locating by the processor any deflate exclude range defining a portion of the temporary buffer to be excluded from deflate compression, wherein the deflate exclude range logically partitions the temporary buffer into at least one deflate view range; and f) processing each deflate view range for deflate compression, wherein each deflate view range eligible for deflation is deflated to store an associated DEFLATE item in an output buffer, wherein each deflate view range ineligible for deflation is stored as a NODEFLATE item in the output buffer.

31. The computer-implemented method of claim 26 wherein step b) further comprises identifying by the processor any deflate exclude range boundaries within the input buffer, wherein RPR compression is performed only on portions of the input buffer that are not within the deflate exclude range boundaries.

32. The computer-implemented method of claim 26 wherein the RPR compression processing replaces a number of adjacent consecutive occurrences of a symbol pattern with a RPR item identifying the symbol pattern and a number of occurrences.

33. The computer-implemented method of claim 26 wherein the RPR compression processing replaces any occurrences of a predefined list of symbol patterns with an RPR item.

* * * * *